United States Patent [19]

Nieder et al.

[11] Patent Number: 5,385,865

[45] Date of Patent: Jan. 31, 1995

[54] METHOD OF GENERATING ACTIVE SEMICONDUCTOR STRUCTURES BY MEANS OF STARTING STRUCTURES WHITH HAVE A 2D CHARGE CARRIER LAYER PARALLEL TO THE SURFACE

[75] Inventors: Johannes Nieder; Peter Grambow, both of Stuttgart; Herbert Lage, Bad Liebenzell; Klaus Ploog, Stuttgart; Andreas Wieck, Sindelfingen; Detlef Heitmann, Borstel-Hohenraden; Klaus Von Klitzing, Stuttgart, all of Germany

[73] Assignee: Max-Planck-Gesellschaft Zur Forderung Der Wissenschaften, Gottingen, Germany

[21] Appl. No.: 724,426

[22] Filed: Jul. 3, 1991

Related U.S. Application Data

[63] Continuation-in-part of Ser. No. 513,995, Apr. 26, 1990.

[30] Foreign Application Priority Data

Jul. 6, 1990 [EP] European Pat. Off. ........... 90112970

[51] Int. Cl.⁶ .......................................... H01L 21/306
[52] U.S. Cl. .................................. 437/133; 437/203; 437/225; 437/228
[58] Field of Search ............... 437/228, 225, 133, 203; 357/16

[56] References Cited

U.S. PATENT DOCUMENTS

| | | | |
|---|---|---|---|
| 3,655,457 | 4/1972 | Duffy | 437/127 |
| 3,696,274 | 10/1978 | Davis | 257/527 |
| 4,325,073 | 4/1982 | Hughes et al. | 437/133 |
| 4,325,181 | 4/1982 | Yoder | 437/133 |
| 4,460,910 | 7/1984 | Chappell et al. | 357/16 |
| 4,771,013 | 9/1988 | Curran | 437/31 |
| 4,796,068 | 1/1989 | Katayama | 257/120 |
| 4,853,341 | 8/1989 | Nishioka | 437/24 |
| 4,989,052 | 1/1991 | Okada | 257/194 |
| 5,141,879 | 8/1992 | Goronkin et al. | 437/133 |

FOREIGN PATENT DOCUMENTS

| | | |
|---|---|---|
| 0170023 | 6/1985 | European Pat. Off. |
| 0308166 | 9/1988 | European Pat. Off. |
| 0394757 | 4/1990 | European Pat. Off. |
| 2556038 | 6/1976 | Germany |
| 3221304A1 | 12/1983 | Germany |
| 3545434A1 | 3/1986 | Germany |
| 3541587A1 | 5/1986 | Germany |
| 3724012A1 | 2/1989 | Germany |
| 2-78232 | 3/1990 | Japan .................... 437/133 |

OTHER PUBLICATIONS

Demel et al, "One dimensional electronic systems in ultrafine mesa-etched single and multiple quantum well wires", Appl. Phys. lett. 53(22), 28 Nov. 1988, pp. 2176–2178.

Wiecke et al., "In-plane-gated quantum wire transistor fabricated with directly written focused ion beams", Appl. Phys. lett. 56(10), 5 Mar. 1990, pp. 928–930.

Moreland et al, "Air as an adjustable insulator for C–V and G–V analysis of semiconductor surfaces", Appl-Phys. lett. 45(1), 1 Jul. 1984, pp. 104–105.

(List continued on next page.)

*Primary Examiner*—R. Bruce Breneman
*Assistant Examiner*—Ourmazd S. Ojam
*Attorney, Agent, or Firm*—Townsend and Townsend Khourie and Crew

[57] ABSTRACT

A novel unipolar transistor device has been realized starting from two-dimensional electron systems (2DES) in modulation-doped AlGaAS/GaAs heterostructures. A 600 nm wide 1D channel is insulated laterally from 2DES regimes by 700 nm wide deep mesa etched trenches. The conductivity in the quasi-one-dimensional channel can be tuned via the in-plane lateral-field effect of the adjacent 2DES-gates where the vacuum (or air) in the etched trenches serves as the dielectric. Room temperature operation is demonstrated yielding a 161S transconductance corresponding to 160 mS/mm 2D transconductance.

17 Claims, 30 Drawing Sheets

OTHER PUBLICATIONS

Eden et al, "Integrated circuits: the case for gallium arsenide", IEEE spectrum, Dec. 1983, pp. 30-37.

Skocpol, W. J., et al., "Quantum Transport in Narrow Mosfet Channels," Surface Science 170 (1986) pp. 1-13.

Grambow, P., "Preparation of One-Dimensional Single and Multi-Layered Quantum Wire Structures by Ultrafine Deep Mesa Etching Techniques," Microelectronic Engineering 9 (1989) pp. 357-360.

Hirayama, et al., "Conductance Characteristics of Ballistic One-Dimensional Channels Controlled by a Gate Electrode," Appl. Phys. Lett. 54 (25), 19 Jun. 1989, pp. 2556-2558.

Nakamura, et al., "Electron Focusing with Multiparallel One-Dimensional Channels Made by Focused Ion Beam," Appl. Phys. Lett. 56 (4), 22 Jan. 1990, pp. 385-387.

Susumu Namba, "Focused Ion Beam Processing," Nuclear Instruments and Methods in Physics Research B39, (1989) pp. 504-510.

"Semiconductor Two-Dimensional Hole Gas Heterostructures," IBM Technical Disclosure Bulletin, vol. 29, No. 5, Oct. 1986.

D'Avanzo, D. C., "Proton Isolation for GaAs Integrated Circuits," IEEE Transactions on Electron Devices, vol. ED-29, No. 7, Jul. 1982, pp. 1051-1059.

Deng, X., "Oxygen Ion Beam Modification of GaAs," 2107 Nuclear Instruments & Methods in Physics Research, vols. 209/210, May 1983, pp. 657-661.

Hiramoto, T., "Fabrication of One-Dimensional GaAs Wires by Focused Ion Beam Implantation," J. Vac. Sci. Technol. B 6 (3), May/Jun. 1988, pp. 1014-1017.

Miyauchi, E., "Application of Focused Ion Beam Technology to Maskless Ion Implantation in a Molecular Beam Epitady Grown GaAs or AlGaAs Epitaxial Layer for Three-Dimensional Pattern Doping Crystal Growth," J. Vac. Sci. Technol. A 4 (3), May/Jun. 1986, pp. 933-938.

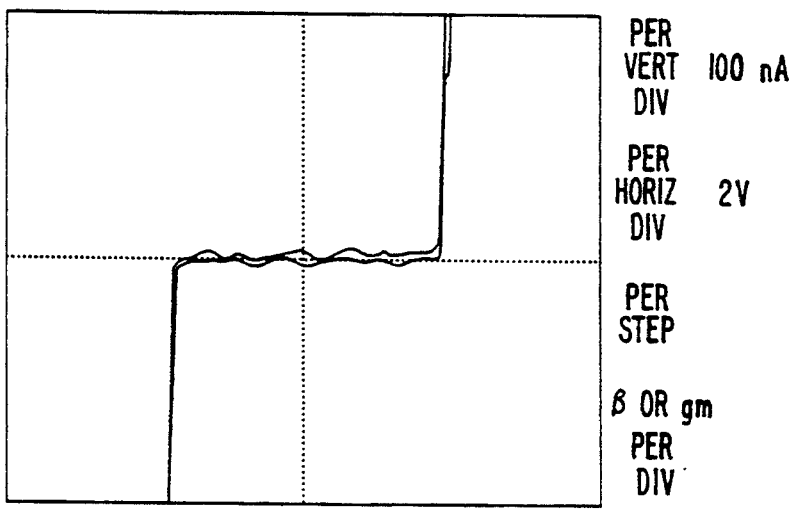
FIG. IIA.
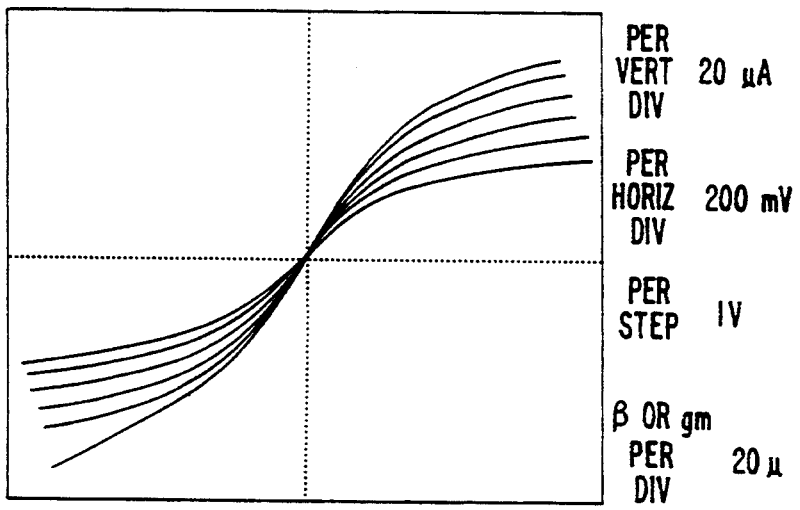
FIG. IIB.
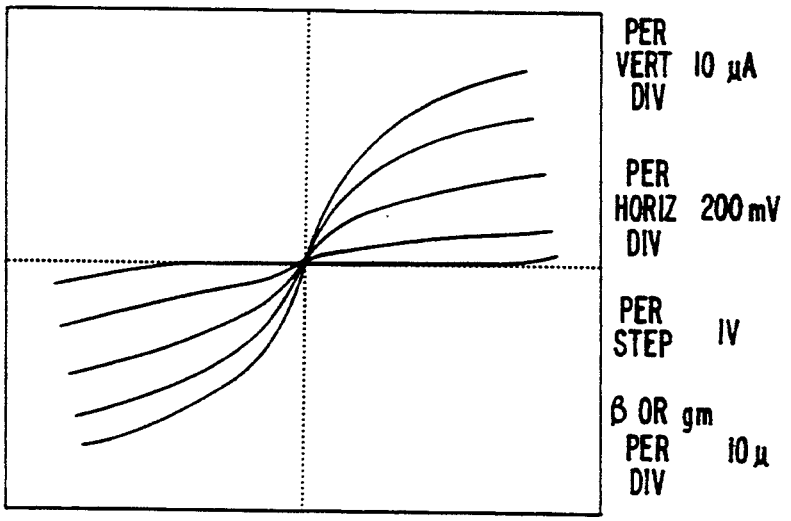
FIG. IIC.

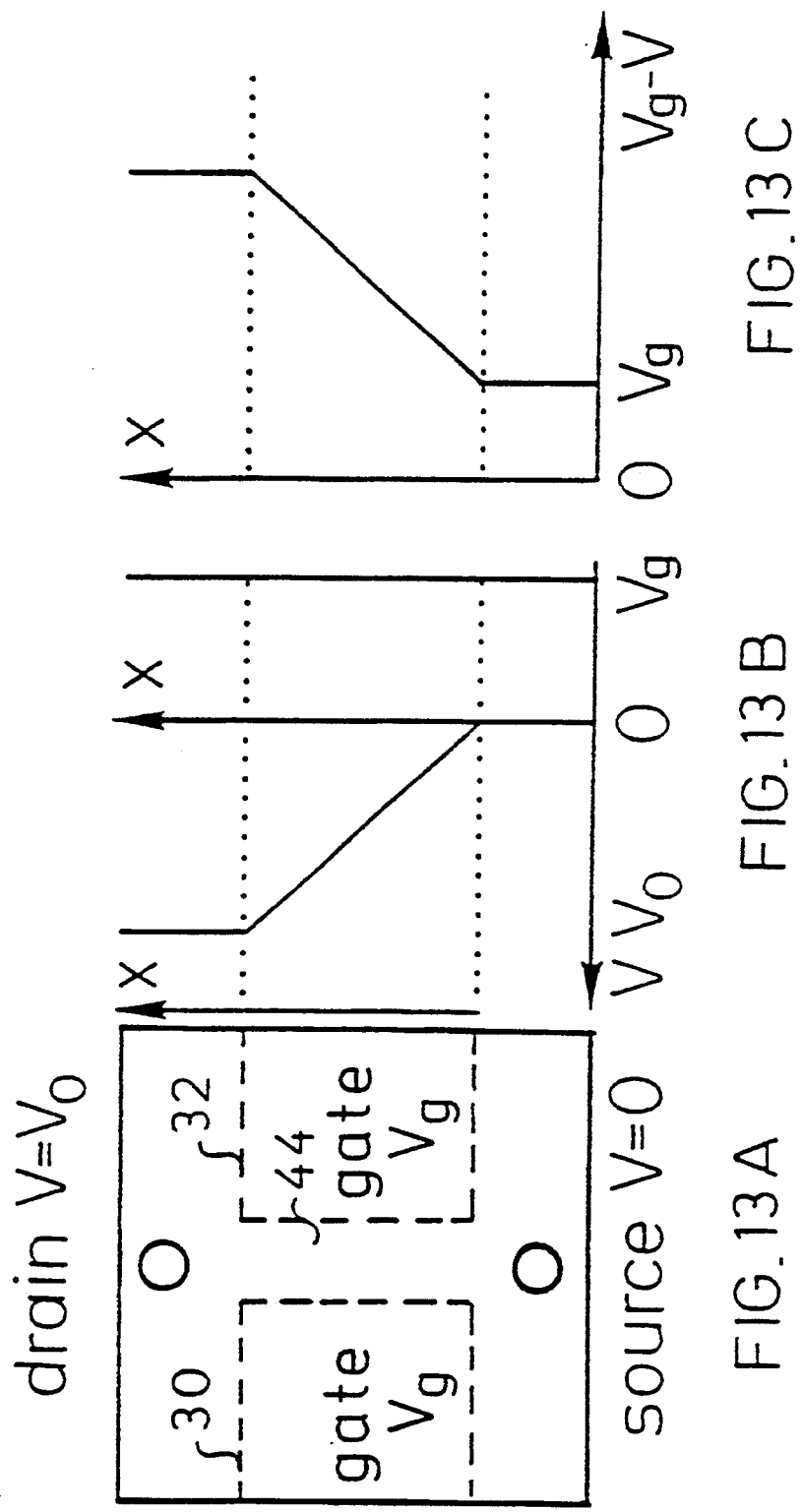

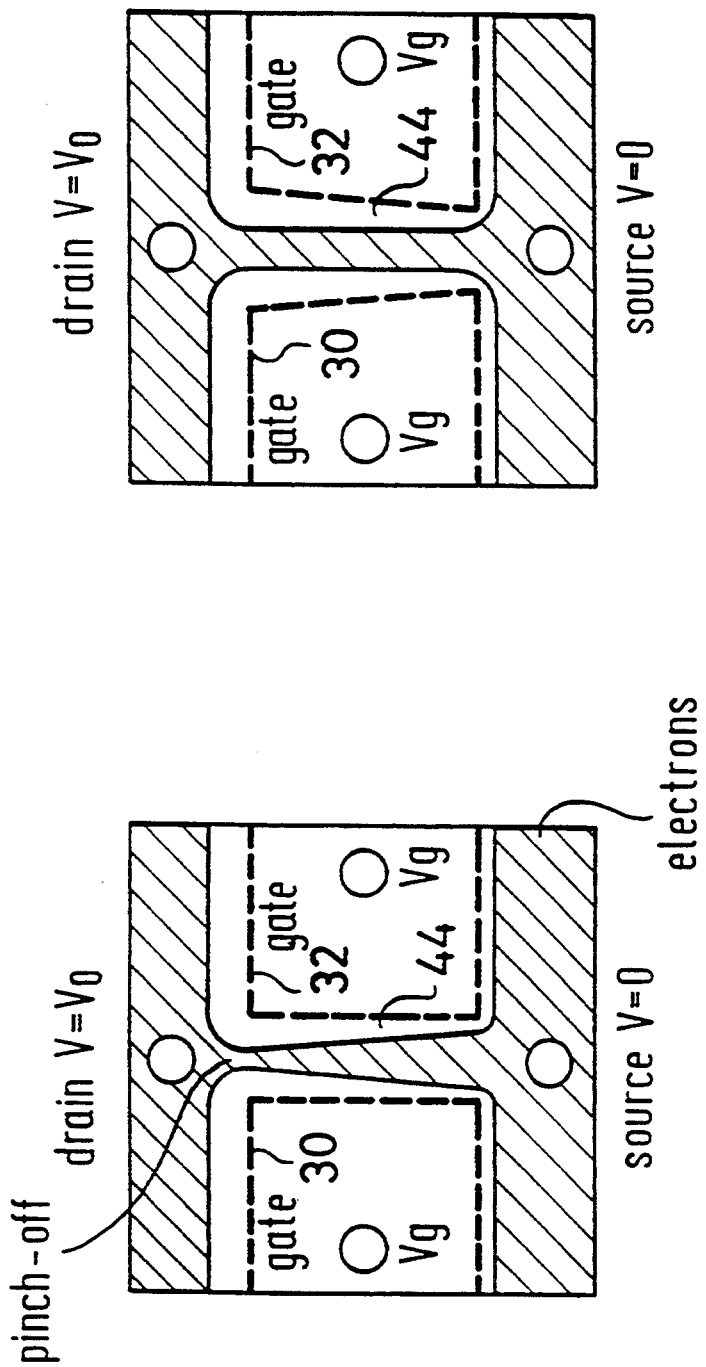

OR-GATE

AND-GATE

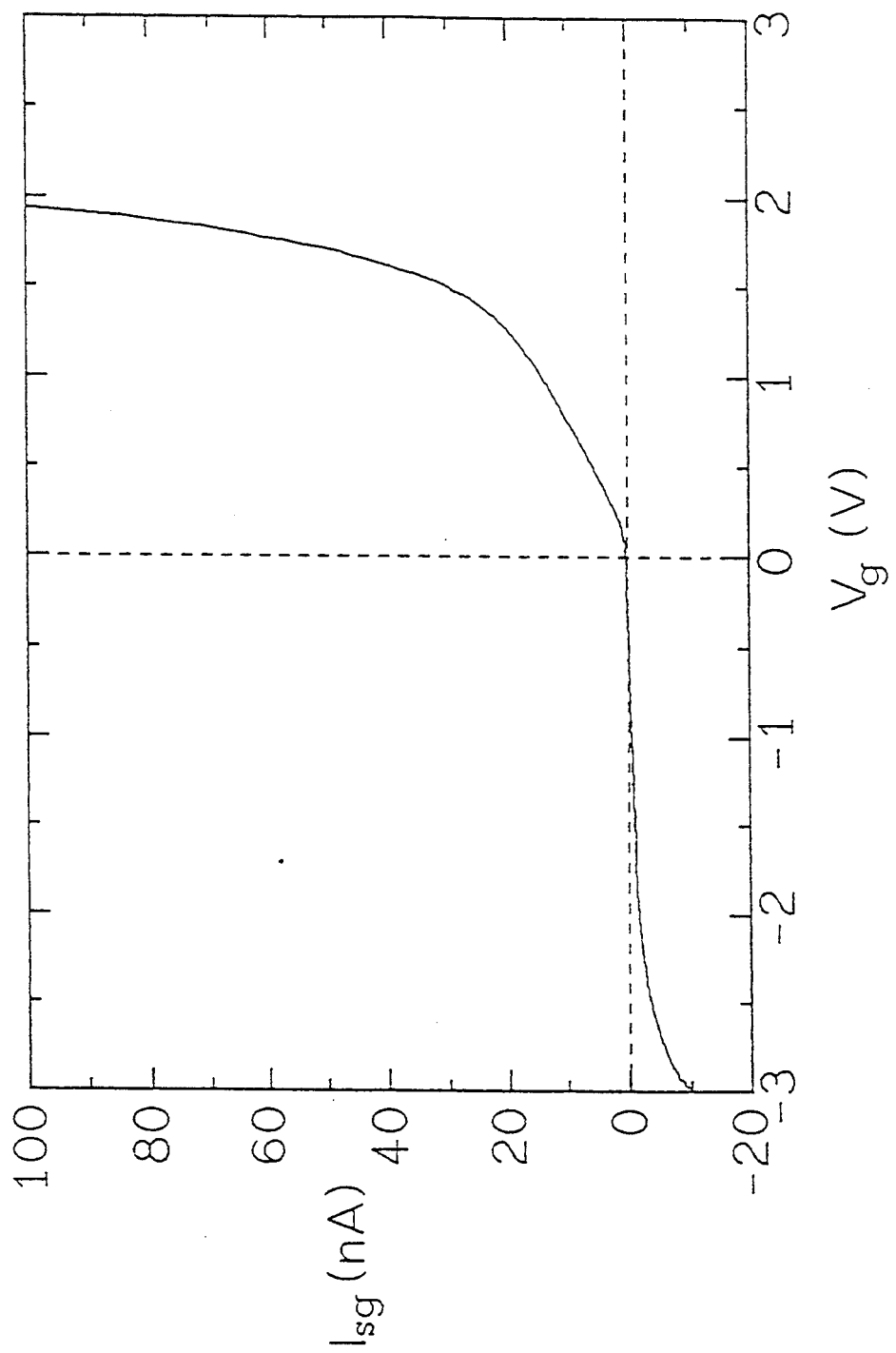

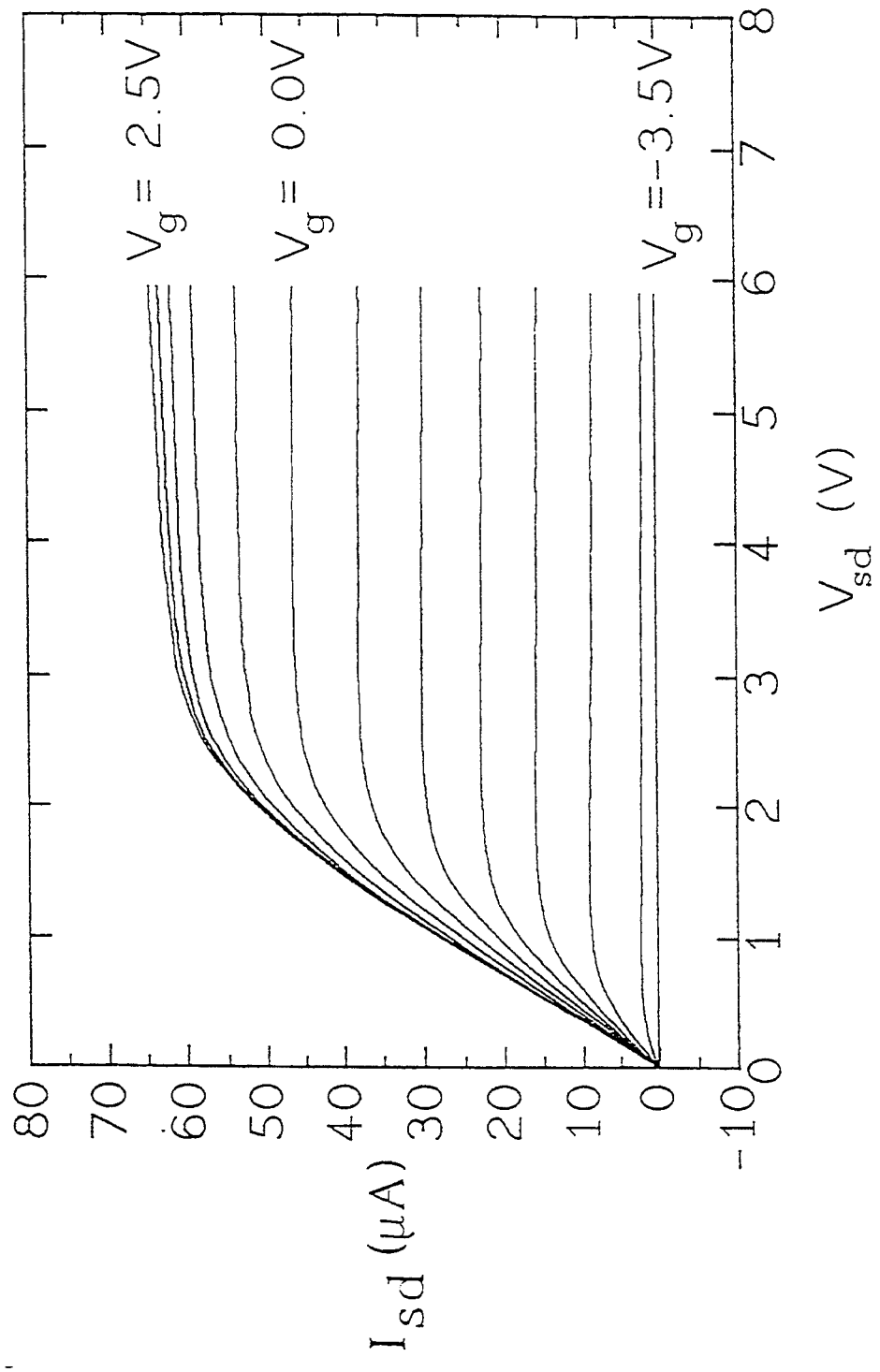

METHOD OF GENERATING ACTIVE SEMICONDUCTOR STRUCTURES BY MEANS OF STARTING STRUCTURES WHITH HAVE A 2D CHARGE CARRIER LAYER PARALLEL TO THE SURFACE

RELATED APPLICATIONS

This is a continuation-in-part application of the pending U.S. patent application, Ser. No. 513,995 filed on Apr. 26, 1990.

In European patent application No. 90 106 940.1 publication number EP 0 394 757 (corresponding to the above referenced U.S. application Ser. No. 513,995) there are described methods of generating active semiconductor structures by means of starting structures which have a 2D-charge carrier layer parallel to the surface. The description also extends to field effect transistors manufactured in accordance with this method and to the manufacture of integrated and highly integrated circuits using the method.

In essence the method described in the above-mentioned European application proposes a basic method of generating active semiconductor structures by means of starting structures which have a 2D charge carrier layer parallel to the surface, with contacts being provided to this 2D-charge carrier layer, wherein one divides up the starting structure regionally by treating it to build up lateral potential barriers in the 2D-charge carrier layer, with a channel being formed between at least one closed region and a line lying opposite to the closed region, with the width of the channel lying in the order of magnitude of the thickness of the 2D-charge carrier layer, i.e. of the electron wavelength, and with the closed region and also the regions formed on both sides of the line being contacted. In the basic method the starting structure is divided up regionally by using focussed ion beams to form insulating boundaries between the regions.

Furthermore, the European application 90 106 940.1 describes a method for the manufacture of an integrated or highly integrated circuit, characterised in that one takes a starting structure on semiconductor basis which has at least one 2D-charge carrier layer parallel to the surface; in that one builds up lateral potential barriers in this 2D-charge carrier layer in order to define active and passive components with electrode and channel regions through respective portions of the 2D-charge carrier layer, with electrode regions of neighbouring components which are connected to one another being in a conductive connection with one another via the 2D-charge carrier layer which is located therebetween; and in that the conductivity of the channel regions of the active components can be modified by the application of suitable control potentials to the neighbouring gate regions, with the width of these channel regions lying in the order of magnitude of the thickness of the 2D-charge carrier layer; and in that for the external connections to the circuit one produces a contact in selected electrode regions to the respective portion of the 2D-charge carrier layer.

The above-mentioned European application discloses two specific methods of treating the starting structure in order to build up lateral potential barriers therein. The first method comprises ion bombardment and the second ion implantation.

The present proposal is concerned with an extension of this method and has as its principal object the provision of a further method of treating the starting structure in order to build up the lateral potential barriers necessary to divide the starting structure up regionally.

The present invention proposes that these lateral potential barriers should be produced by lithographic and etching techniques, and indeed use can be made of lithographic and etching techniques which are already known per se.

The present invention thus relates to the use of established technology to produce the novel structures.

Thus instead of using insulation produced by focussed ion beams the present invention proposes that the insulation should be formed by deep etched channels or trenches and in this system an electrostatic field effect can also be observed.

Particular advantages of the present proposal are
1. compatibility with state of the art fabrication processes,
2. insulation through two surfaces (the "walls" of the trenches) and thus fewer defects (traps) than in the volume damaged ion beam written structures, which should improve the high frequency characteristics,
3. better insulation of the gates due to deeper etching,
4. the possibility of introducing desirable dielectrics into the etched channels which can change or improve the characteristics of the semiconductor device, typically a field effect transistor, which can thus act as a solid body, liquid or gas controlled transistor (sensor).
5. the ability to fabricate ring oscillators which oscillate in the Terahertz frequency range,
6. the possibility of obtaining oscillation at high frequencies in the optical range such that a plurality of oscillators can act as a light source, for example for room illumination, and indeed with an energy conversion efficiency substantially higher than that currently obtainable with existing light sources.

Whilst it is possible to use the method of the present invention to form single semiconductor structures, for example in the form of a field effect transistor, the method is also ideally suited to the manufacture of an integrated or highly integrated circuit comprising a plurality of active and passive components.

The method of the present invention is applicable to a wide range of material systems comprising heterogenous semiconductor material systems, for example compositional semiconductors, and also homogenous semiconductor materials such as silicon. The ability to use the method of the present invention with silicon semiconductors is a particular advantage since silicon technology has a dominant position in the field of mass produced semiconductor devices, i.e. the present invention is fully compatible with existing technology and could be implemented by many of the companies currently manufacturing silicon semiconductors.

The production of deep etched channels or trenches which are not filled in the final structure provides, probably for the first time, the opportunity to act directly at the side edge of a two-dimensional charge carrier layer.

Since the properties of the devices that are made can be expected to depend to some degree on the material that is present in the trenches, one can also readily consider using devices fabricated in accordance with the present invention for the detection of substances, primarily gases or liquids which are able to enter the trenches. A basic detector can for example take the form of a straighfoward transistor and a circuit for detecting or measuring a characteristic of the transistor. Since the measured characteristic can be expected to depend on the material actually present in the trench the measurement of the characteristic provides a way of detecting whether or not a particular material is present in the trench.

In the case of liquids in particular there may well be a tendency for the substance to be detected to be retained in the trench due to surface tension. Under such circumstances it may be necessary to provide a flushing system to flush out the trenches with a flushing medium, for example a compressed air flushing system prior to and/or after the detection step. In this way the device could be prepared for the next detection, and indeed a calibration check could be made between measurements to establish that the characteristic obtained is that normally obtained with the flushing medium in the trenches. Such a check would provide an indication that the detector is working in the intended manner.

An alternative and preferred method of detecting substances is however to form an oscillator using the method of the present invention and to sweep the frequency of the oscillator through a range of frequencies. The frequency response, for example the amplitude of characteristic frequencies, can then be evaluated to see if it corresponds with the frequency response which is characteristic for the substance to be detected.

One of the prime advantages of field effect transistors manufactured in accordance with the previous proposal of EP-A-394 757 is the fact that the inherent capacitances of the devices are extremely low so that switching times are very short and the devices can operate at extremely high frequencies. This benefit also applies in equal manner to structures in accordance with the present development of the original proposal. These capacitances are so low that oscillation in the Terahertz range is straightforwardly possible. Thus simple oscillators can be built using the present invention (and also the invention of EP-A-394 757) which will directly generate electromagnetic radiation, for example also in the visible light range. A light source formed in this way can be expected to have an efficiency, better than 80%, i.e. of the energy input 80% is converted into visible light and this is substantially higher than the best energy conversion efficiencies obtainably with state of the art light sources.

Particularly preferred devices constructed in accordance with the present invention are set forth in the claims.

In order to make the present proposal clearer the description of FIGS. 1 to 17 of the previous proposal will be repeated here together with a discussion of the new proposal with reference to the further FIGS. 18 and 28.

More specifically the drawings show the following:

BRIEF DESCRIPTION OF THE DRAWINGS

FIG. 13A a plan view of an alternative embodiment of an FET in accordance with the invention, FIG. 13B a representation of the shape of the potential distribution along the X-direction in FIG. 13A, FIG. 13C a schematic representation of the potential $V_g-V$ in the direction X in FIG. 13A which determines the strength of the E-field, FIG. 13D the constriction of the channel caused by the potential distribution of FIG. 13C, FIG. 14 an improved shape in comparison to FIG. 13A of the sides of the gate electrode regions of an FET of the invention which form the channel, FIG. 15A an OR-gate manufactured in accordance with the invention, FIG. 15B the equivalent circuit diagram for the OR-gate of FIG. 15A, FIG. 16A an AND-gate produced in accordance with the invention, FIG. 16B the equivalent circuit diagram for the AND-gate of FIG. 16A, FIGS. 17A and B an alternative version of the OR-gate and of the AND-gate of FIGS. 15A and 16B respectively.

FIG. 19 Current-voltage characteristics of the device shown in FIG. 18 at room temperature. A) $I_{sg}$-$V_g$ characteristic showing the insulation behaviour between the in-plane-gates and the channel. B) $I_{sd}$-$V_{sd}$ characteristics of the channel for different gate voltages varied from $V_g = 1.5$ V (top) to $V_g = -2.0$ V (bottom) in steps of 0.5 V.

First of all FIG. 1 shows a semiconductor structure of a compositional semiconductor on the basis of $Al_x$-$Ga_{1-x}As$. This structure has been grown such that the surface 10 in Miller indices is a (100) surface or equivalent. The structure comprises a gallium-arsenide-substrate 12 of approximately 300 $\mu$m thickness which is undoped. On this substrate there are then grown approximately 30 periods of undoped alternating layers of AlAs- and GaAs 14, 16 with however only four such periods being shown for the sake of illustration. These layers form the so called dustbin-layers (buffer layers) which hold back the contamination contained in the substrate at the boundary surfaces, so that the upper buffer layers remain relatively clean. The individual buffer layers are approximately 30 Å thick (AlAs 30 Å, GaAs 25 Å). On these layers a layer 18 of undoped gallium arsenide is then grown with a thickness of approximately 1.25$\mu$. This layer 18 is then followed by a layer of $Al_{0.3}Ga_{0.7}As$ of approximately 190 Å thickness, with this layer also being undoped. A further layer 22 of doped $Al_{0.3}Ga_{0.7}As$ of approximately 480 Å is then grown onto this undoped layer 20, with the doping being effected by means of silicon atoms, and indeed with a doping density of approximately $10^{18}$ cm$^{-3}$.

The structure is then terminated with a final gallium arsenide layer 24 of approximately 100 Å, with this layer also being undoped.

Figure 1:
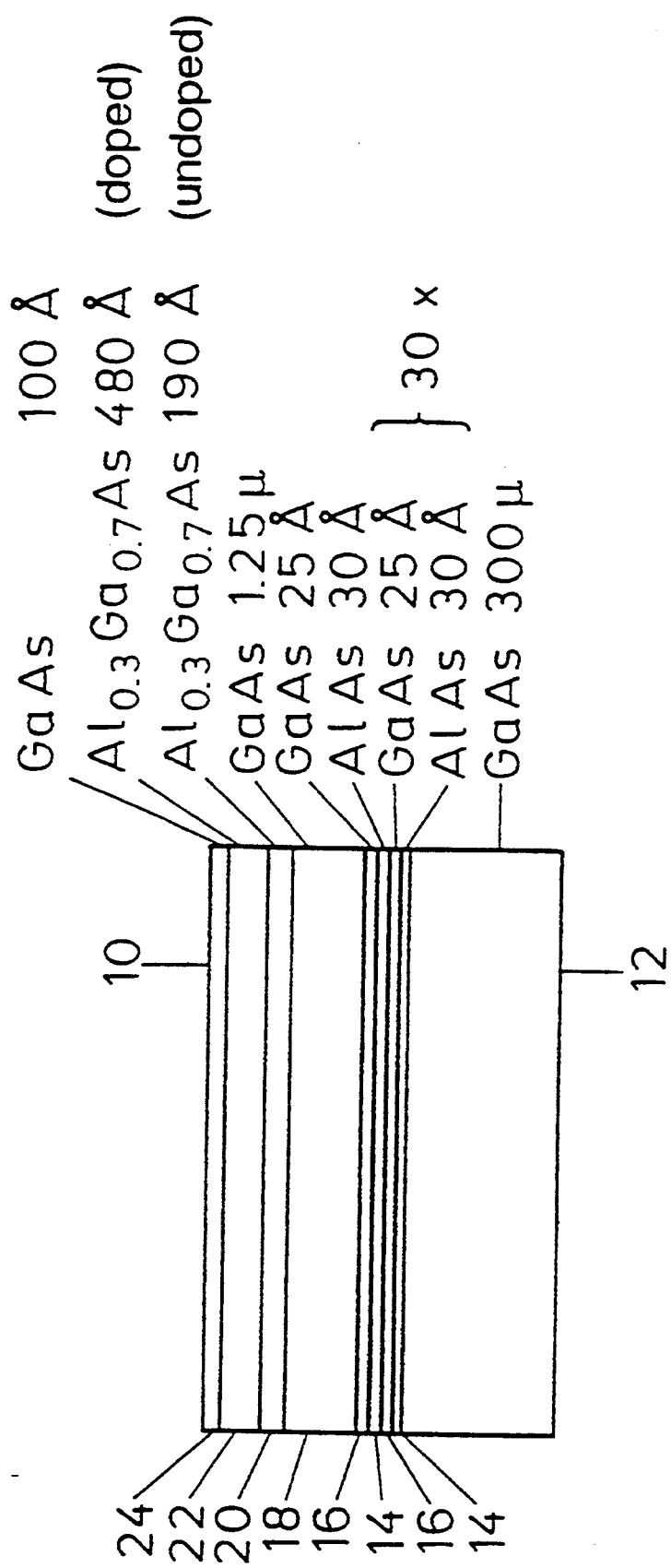
FIG. 1 a cross section through a starting structure which is suitable for the manufacture of the field effect transistors and integrated circuits of the invention, FIG. 2 a band diagram of the active region of the starting structure of FIG. 1, FIG. 3 a schematic plan view of a starting structure such as that of FIG. 1 which has been treated by means of a focussed ion beam for the formation of a field effect transistor, FIG. 4 a plan view corresponding to FIG. 3, however of a modified embodiment, FIG. 5 a diagram of the channel resistance as a function of the applied gate potential in the embodiment of FIG. 3 in which the same potential is applied to the two gate regions, FIG. 6 a customary circuit diagram of a two stage transistor amplifier, FIG. 7 a plan view of a starting structure in accordance with FIG. 1 onto which the equivalent integrated circuit of the two stage amplifier of FIG. 6 has been written by means of a focussed ion beam, FIG. 8 a schematic plan view of an alternative embodiment of an FET of a starting structure in accordance with FIG. 1, FIG. 9 a schematic representation of a cross section through the channel of FIG. 8, FIG. 10 at the top, a diagram of the gate resistance as a function of the applied gate potential in the embodiment of FIG. 8 in which the one gate was connected to the source and, at the bottom, the deviations from a straight line of the conductivity shown in FIG. 10 at the top, FIGS. 11A–C current potential (I–V)-characteristics of an IPG-transistor in accordance with FIG. 8 with $W_{geo}=5.2$ μm at T=77K, A) shows the I-V characteristic between the gate and the channel, at $-5.6$ $V \leq Vg \leq 5.6$ V the gates are insulated from the channel, B) shows I-V characteristics for the channel for various positive $V_g$ with the middle point of the diagram being the coordinate origin. The curve with the smallest absolute ordinate values corresponds to $V_g=0$ V, the above lying curves correspond to positive Vg in respective 1 V steps ($V_g=1, 2, 3, 4, 5$ V); in C) I-V characteristics are shown as in B), however for negative Vg. The curve with the largest absolute ordinate values corresponds to $V_g=0$ V, the lower lying curves to $V_g=-1, -2, -3, -4$ V.
Figure 2:
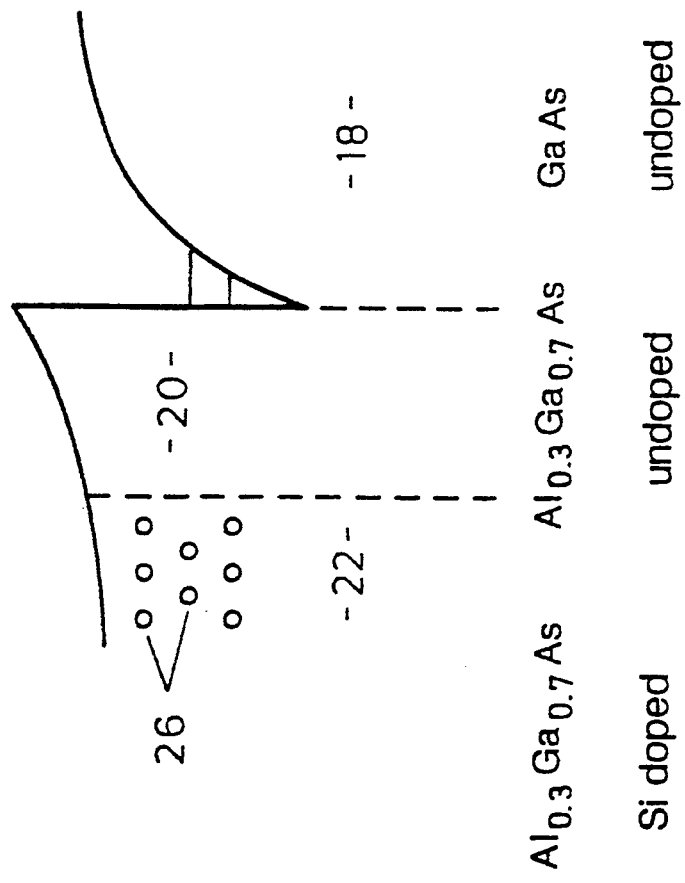

The band structure of the active region of the starting structure of FIG. 1 is shown in FIG. 2. One clearly sees from this band diagram that a potential well forms in the boundary region of the $Al_{0.3}Ga_{0.7}As$ layer 20 and the GaAs layer 18, and that the silicon donor atoms 26 which are spatially separated from this quantum well serve to place electrons into the quantized energy level within the quantum well. The electrons reach this energy level by tunneling through the $Al_{0.3}Ga_{0.7}As$ layer 20.

Figure 3:
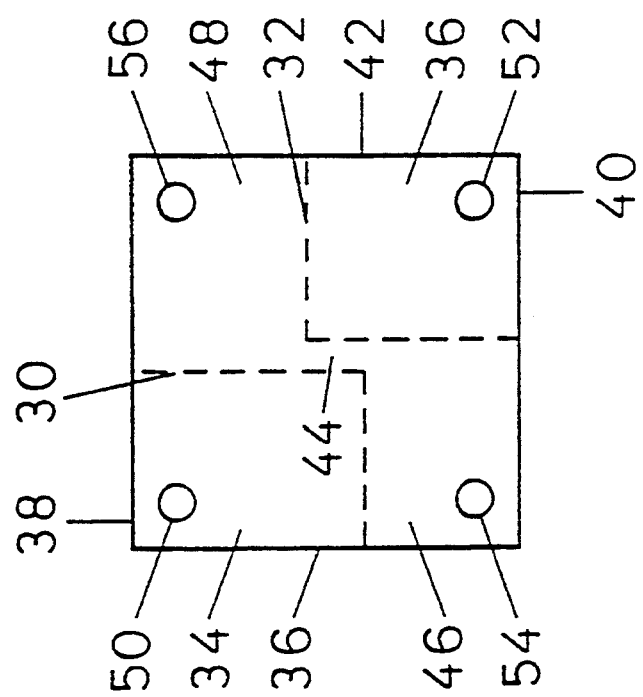

For the formation of the field effect transistor of FIG. 3 a linewise destruction of the starting structure is brought about by means of a focussed ion beam of gallium ions (Ga+) with a beam focus of 0,1 $\mu$m, a beam energy of 100 keV and a current density of 10 mA/mm2 in a vacuum chamber. In this way linear insulating regions 30, 32 arise which in this example both extend around a right angle and divide the chip with a side length of 100 $\mu$m into a source, a drain, a channel and two gate regions. One can imagine the linewise destruction in such a way that the lines are the upper edges of insulating walls which extend through the entire structure perpendicular to the surface of the starting structure. Thus the line 30 surrounds a closed gate electrode region 34 and the line 32 surrounds a closed gate electrode region 36. These regions are not only enclosed in this example by the lines 30 and 32 but rather also by the edge regions 37 and 38 and 40, 42 of the chip.

Between the gate regions there is defined a channel region 44 which extends from a source region 46 up to a drain region 48. The regions 34, 36, 46 and 48 are provided with diffused metallic contacts 50, 52, 54 and 56 which represent the external connections of the field effect transistor. As a two dimensional electron gas is present in each region and extends over the entire width of each region, potentials which are applied to the contacted areas are also applied over the entire respective electrode region.

After the insulating lines have been written in the field effect transistors should be kept in accordance with the invention in the dark. The width of the conductive channel 44 between the two gate electrode regions is approximately 5 $\mu$m in the present example, in practice even smaller regions are conceivable, indeed widths under 1 $\mu$m.

As previously mentioned the field effect transistor of FIG. 3 can be so operated that the two gate electrode regions 34 and 36 are coupled together by an external conductive connection. One can however also apply different gate potentials to the gate electrodes with the likewise previously described advantages.

Figure 4:
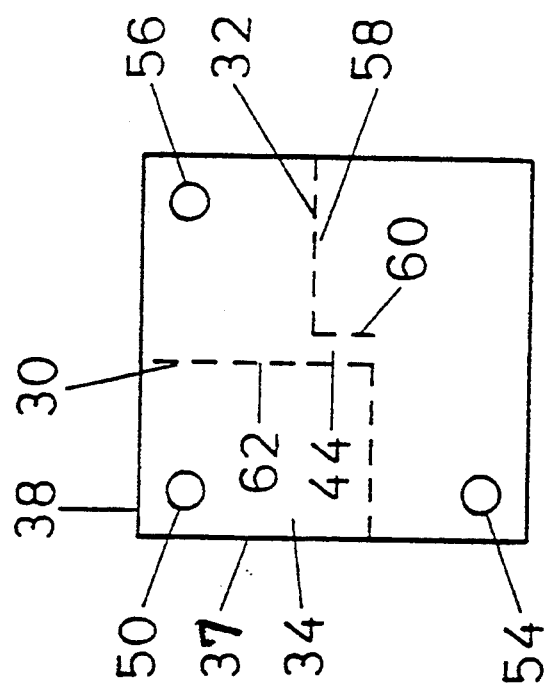

The structure of FIG. 3 can be simplified even further, which is shown in FIG. 4. Here the line 30 is executed precisely as in the embodiment of FIG. 3, the line 32 is however now formed in such a way that it comprises a first portion 58 which extends up to the right side of the chip and of an angled portion 60 which extends parallel to the side 62 of the rectangular gate region. The conductive channel 44 is formed here between the angled portion 60 and the side 62 of the closed gate electrode region 34. This field effect transistor is now contacted at the three positions, 54, 50 and 56 in order to generate electrical connections to the source, gate and drain.

It is also possible to form the line 32 as a simple line so that the end of the line lies pointwise opposite to the side or corner of the closed electrode region 34. The line which in this case would correspond to the line 58 also does not have to be arranged as shown in FIG. 3, it could for example be drawn from the lower right hand corner of the chip up to shortly before the corner of the enclosed gate region 34.

Figure 5:
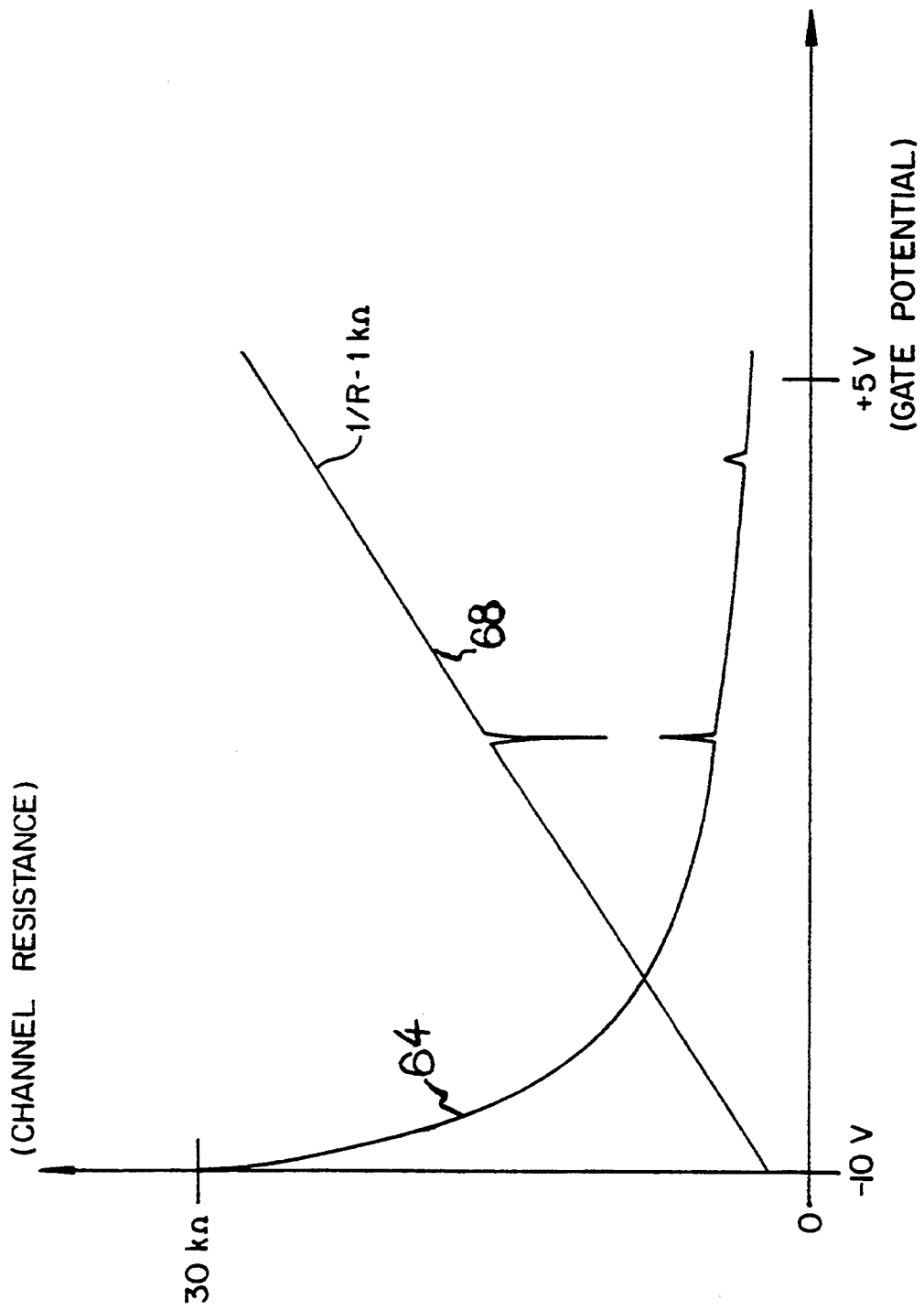

FIG. 5 shows a diagram of the channel resistance as a function of the gate potential in the embodiment of FIG. 3. In the corresponding investigation both gate electrodes 34 and 36 were connected together so that the same gate potential was applied to the two gate electrodes. The peaks 66 which are shown do not belong to the actual measured curve. They were caused by the switching on of other electrical apparatus.

In addition to the somewhat hyperbolic shape of the gate resistance as a function of the applied gate potential the diagram also shows an at least substantially straight line 68 which extends from the bottom left to the top right. Here the reciprocal resistance, i.e. the channel conductivity, is shown as a function of the applied gate potential, with the resistance of the feed lines, in this case 1 kOhm, being taken into account. I.e. the straight line shows a value of $1/(R-1 \text{ kOhm})$. The strict linearity of the reciprocal resistance value shows the excellent characteristics of the field effect transistor.

Figure 6:
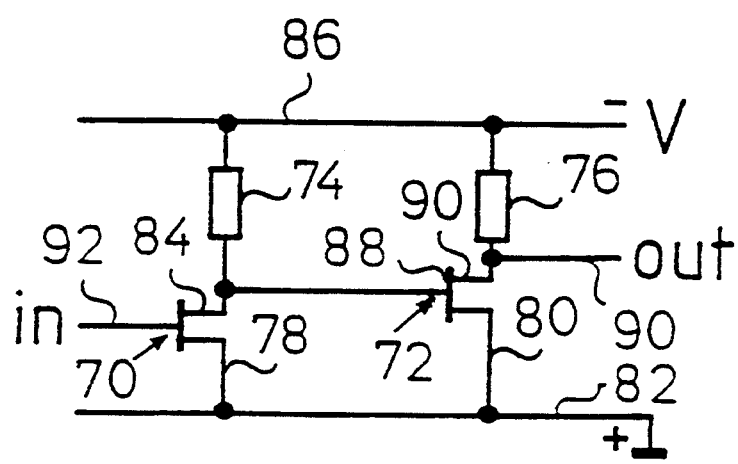

FIG. 6 shows a customary circuit diagram of a two stage amplifier which is formed from two field effect transistors 70 and 72 and also two resistors 74 and 76. The source 78 of the field effect transistor 70 and also the source 80 of the second field effect transistor 72 are connected to the positive terminal 82. The drain 84 of the first field effect transistor 70 is connected via the resistance 74 to the negative terminal 86 and likewise to the gate electrode 88 of the second field effect transistor 72. The drain 90 of the second field effect transistor 72 is applied in corresponding manner via the resistor 76 to the negative terminal 86. A signal to be amplified is applied to the input of the circuit to the gate electrode 92 of the first field effect transistor 70 and the amplified output signal is obtained from the drain 90 of the second field effect transistor 72.

Figure 7:
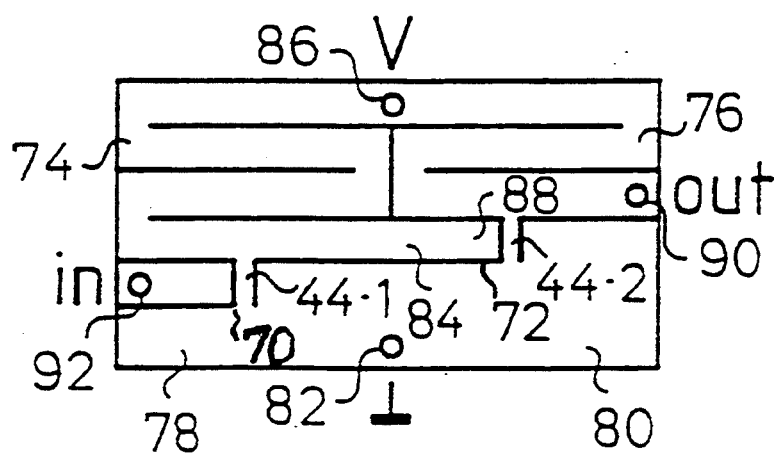

FIG. 7 shows how this two stage amplifier can be realized on a single chip by means of the method of the invention. For a simpler understanding the individual reference numerals of the equivalent circuit diagram of FIG. 6 have been entered into the drawing of FIG. 7 and FIG. 7 is aligned vertically with FIG. 6 and has the same scale in the vertical direction. However, the lines in FIG. 6 signify conductive connections whereas in FIG. 7 they symbolize insulating regions. In this case the chip has a rectangular form with all the lines which lie within the lateral boundary of the rectangular chip 94 being written in by a focussed ion beam in the previously described way and means. The regions 78, 80 represent a common source region which is contacted at 82. I.e. the positive potential is applied at 82 and is distributed to the source regions 78 and 80 which are connected to one another as a result of the 2D electron gas. The negative terminal is applied at 86 at the centre of the upper field of the chip. The input potential is applied at 92 and the output signal is extracted at 90. I.e. 82, 86, 90 and 92 are contacts to the respectively associated regions of the chip.

The region 84 represents the drain electrode of the first field effect transistor 70, the conductive channel 44.1 is defined between the two oppositely disposed and closely spaced insulating lines between the reference numerals 92 and 84. The drain region 84 leads to the left, up the left hand lateral boundary of the chip, then to the right up to the centre of the chip, and then again to the left and back to the right up to the connection terminal 86. The width of this total path is so laid out that a resistor 74 hereby arises.

The two parallel lines lying closely adjacent one another at the right hand side of the chip lie between the reference numerals 84 and 90 and represent the channel 44.2 of the second field effect transistor 72. The drain 90 of the second field effect transistor 72 is connected with the negative terminal 86 via a meander shaped path which represents the resistor 76 and is laid out in accordance with the resistor 74 (however with mirror image symmetry thereto). As a result of this meander path inductivity is associated with the resistors in this embodiment.

With the invention a unipolar electronic component with a quasi one dimensional carrier channel is proposed which has all the characteristics of an FET. This component can be very simply manufactured, has "self alignment" and linear instead of planar gates with very low capacitance. In this way a very high operating frequency is possible. The structure consists of an initially homogenous 2D layer with a high carrier mobility which is produced by epitaxy of for example GaAs. The implantation of accelerated focussed ions (for example Ga+ with 100 keV) locally destroys the conductivity of the electron layer. The irradiated regions remain insulating at low temperature or room temperature even after illuminating the crystal with bandgap radiation. This writing in of the insulating layer is effected along two paths (30, 32) on the platelet so that a 2D-carrier layer is subdivided into three regions which are insulated from one another. The source and drain are only connected via a narrow channel (44) the width of which can be continuously tuned by a gate potential which is simultaneously applied to both gates (34, 36) relative to the source, so that a pronounced change of the carrier concentration and thus of the channel resistance arises.

In the component the electric constriction field exists parallel to the 2D-layer and the destroyed insulating region serves as a dielectric. By increasing a negative gate potential lying in the plane the extent of the electric field rapidly extends beyond the destroyed almost insulating region alongside the path affected by the ion beam. The carriers are thus restricted to a quasi one dimensional channel of the initially high quality chip and the gate potential influences only the charge carrier density, not however the high mobility. This can be very important for ballistic transport where large free mean path lengths are required.

In the following the invention will be explained in further detail with particular emphasis on technological and scientific aspects which are important to the invention.

The present day technology of field effect transistors is based exclusively on the "planar" field effect, i.e. the gate which influences the electronically inductive layer forms a plate capacitor with this layer. It is only recently that the inhomogenous scattered field at the edges of such gates has been exploited in basic research to generate quasi one dimensional channels. The disadvantage of these surface gates is that the inherent capacitances are large and thus the maximum working frequencies are restricted. Moreoever, the manufacture of such laterally restricted layer structures is relatively complicated, in particular the sub-μm-precise positioning of the source and drain relative to the gate. The IPG (In-Plane-Gate) transistor proposed here does not have these disadvantages and can moreover be rapidly manufactured in a single technology step without masks and chemical processes. In this way the positioning problems are completely avoided.

Figure 8:
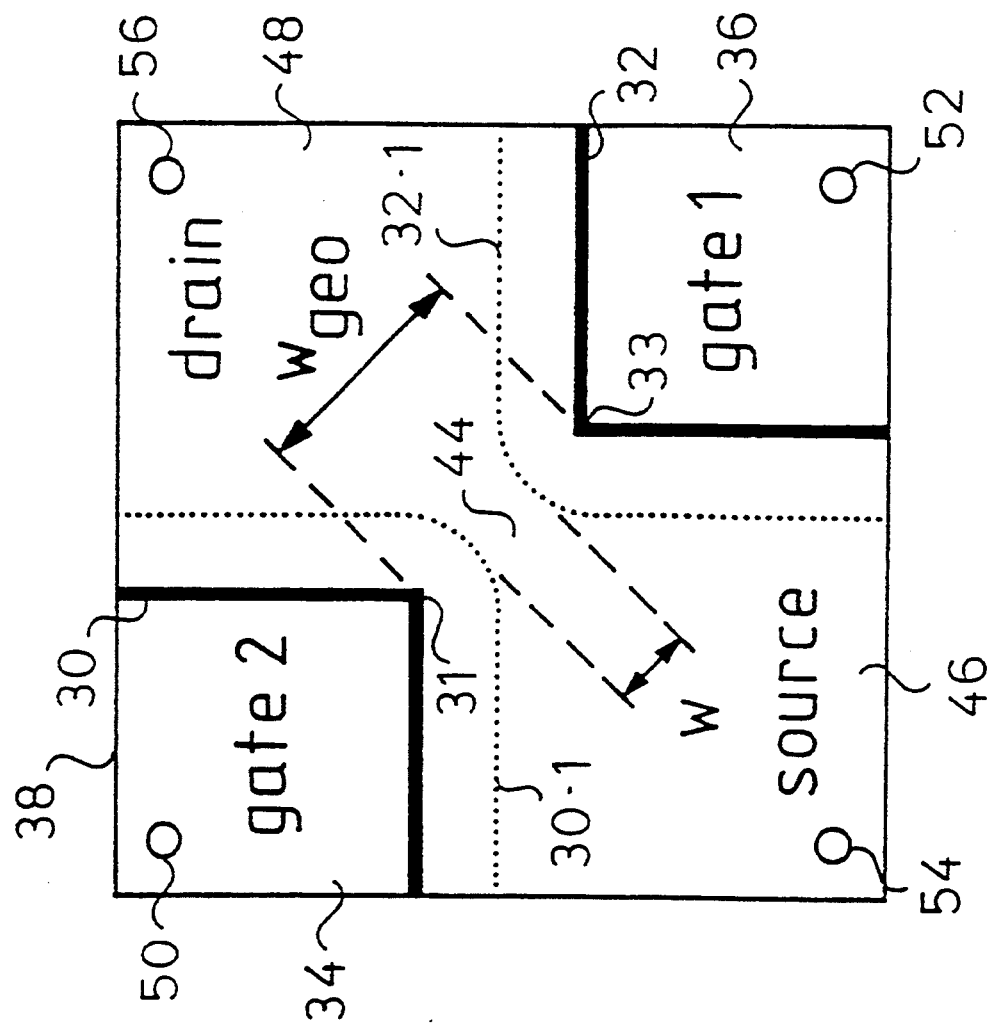

The basis for the manufacture of the new structure is the lateral local passivation ("insulating writing") of the conductivity of an originally homogenous electronic layer at the boundary surface of a heterostructure, preferably of a $Al_{0.3}Ga_{0.7}As$-GaAs heterostructure. In a heterostructure of this kind the energy band discontinuity between the $Al_{0.3}Ga_{0.7}As$-GaAs and the GaAs leads with suitable doping to band bending in which an electron edge layer is formed just beneath the crystal surface. This electron edge layer has a thickness of 10 nm (which corresponds approximately to the de Broglie wavelength of the electrons) and is so thin that quantum effects perpendicular to it are important and one speaks of a two dimensional electron gas (2DEG). The insulating writing in the 2DEG can for example take place with a finely focussed $Ga^+$ ion beam (focussed ion beam, FIB) with 100 keV energy, 100 nm focussed diameter. One can in this way "cut" the electrical conductivity of the 2DEG into desired regions with the ion beam. One uses this insulating writing in accordance with FIG. 8, with an ion beam incident perpendicular to a heterostructure, to write two lines which divide the 2DEG into three regions gate 1 (36), gate 2 (34) and the source and drain regions 46, 48 which are connected by a very narrow channel 44. As the structure of FIG. 8 corresponds to that of FIG. 3 the same reference numerals have been used for the same parts. The basic structure corresponds in other respects fully to that of FIG. 1. One notes that in the embodiment of FIG. 8 the insulating lines 30 and 32 formed by the ion beam are so arranged that the respective corners 31, 33 lie opposite to one another which represents a very advantageous arrangement as the channel has an ideal form and the shortest possible channel arises.

Figure 9:
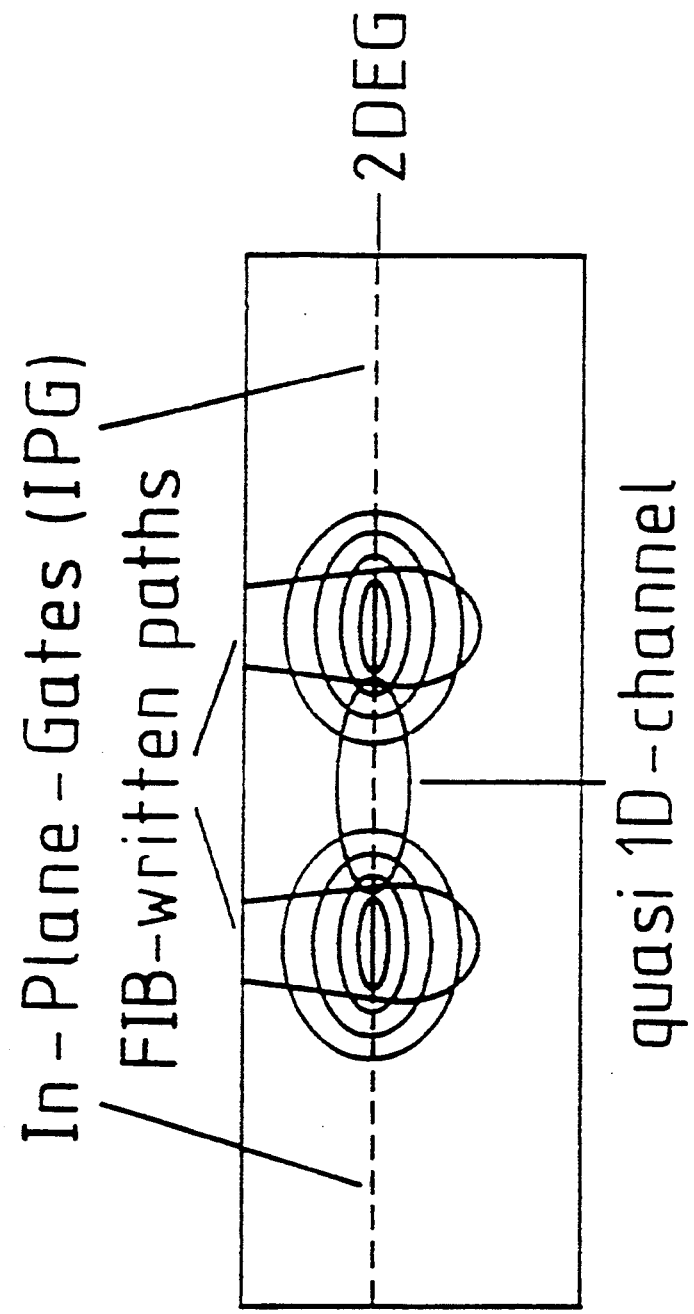

A narrowed region arises between the source and the drain the effective electrical width w of which is smaller than the smallest spacing $w_{geo}$ between the FIB lines. The chain dotted lines 30.1 and 32.1 represent the boundary between the non-destroyed crystal structure and the destroyed structure and take account of the fact that the destruction by the ion beam goes beyond the linear region 30, 32 characterized by the solid lines. In as much as the regions of the 2DEG to the right and the left of this channel (gate 1 and gate 2) are electrostatic gates to which a gate potential $V_a$ is applied relative to the channel (source terminal) w can be varied from a few μm down to zero. The distribution of the electric field E in this structure is shown by FIG. 9. It can clearly be seen that E lies predominantly in the plane of the 2DEG and thus the channel can be efficiently constricted from both sides. The concentric ellipses to the left and right of the quasi one dimensional channel in the middle indicate the electric field distribution which forms as result of the applied gate potential. As a result of the small extent of the 2DEG in the crystal growth direction (ca. 10 nm) and also of the lateral corners of the gate there is additionally an increase in the field (tip action) in the vicinity of the channel which favors this process. The special feature of the structure is not only the simple manufacture of quasi one dimensional conductive channels but rather also the method of producing gates from the same conductive structure as well as the channel, namely from the 2DEG. In this way the controlling element "gate" has the same structure as the controlled element "channel". This important principle could be compared with a development which was made at the end of the 1950ies in information science as one recognized that controlling and controlled elements (programs and data) are most effectively exploitable when they coexist in the memory with the same priority. It is to be expected that the identity of the structure of the gates and channels of the invention as realized with the IPG transistor in highly integrated circuits will initiate a comparable new epoche of development in microelectronics as took place in the past in information science.

It is particularly interesting to investigate the gate-channel capacitance. For a short channel IPG structure with $w_{geo}=4.2$ μm a one sided gate channel capacitance $C=100$ fF has been measured. The effective gate region is approximately 100 times shorter than the 350 μm long FIB line, thus the effective capacitance $C_{eff} \sim 1$ fF.

One can also at least roughly estimate the capacitance by theoretical considerations.

The starting electron density of the heterostructure is $n=3\times10^{11}$ cm$^{-2}$=$3\times10^{15}$ m$^{-2}$. With $w_{geo}=4.2$ μm the channel region influenced by the gate may be about $2\times2$ μm large that is $4\times10^{-12}$ m$^2$. Multiplied by n that results in approximately 12000 electrons which can be cleared away with a threshold potential of $V_{th}=-4$ V. The capacitance is thus $12000 \cdot e/4$ V~0.5 fF, which is in surprisingly good agreement with the above measured value.

The gate resistance amounts at room temperature to approximately $R_g=1$ kΩ/per unit area. Multiplied by $C_{eff}$ this results in a time constant of $R_g \cdot C_{eff}=1$ ps, i.e. this structure can operate at a frequency of 1 THz. At low temperatures Rg drops once again by approximately two orders of magnitude so that one can reckon with approximately 100 THz!

Figure 10:
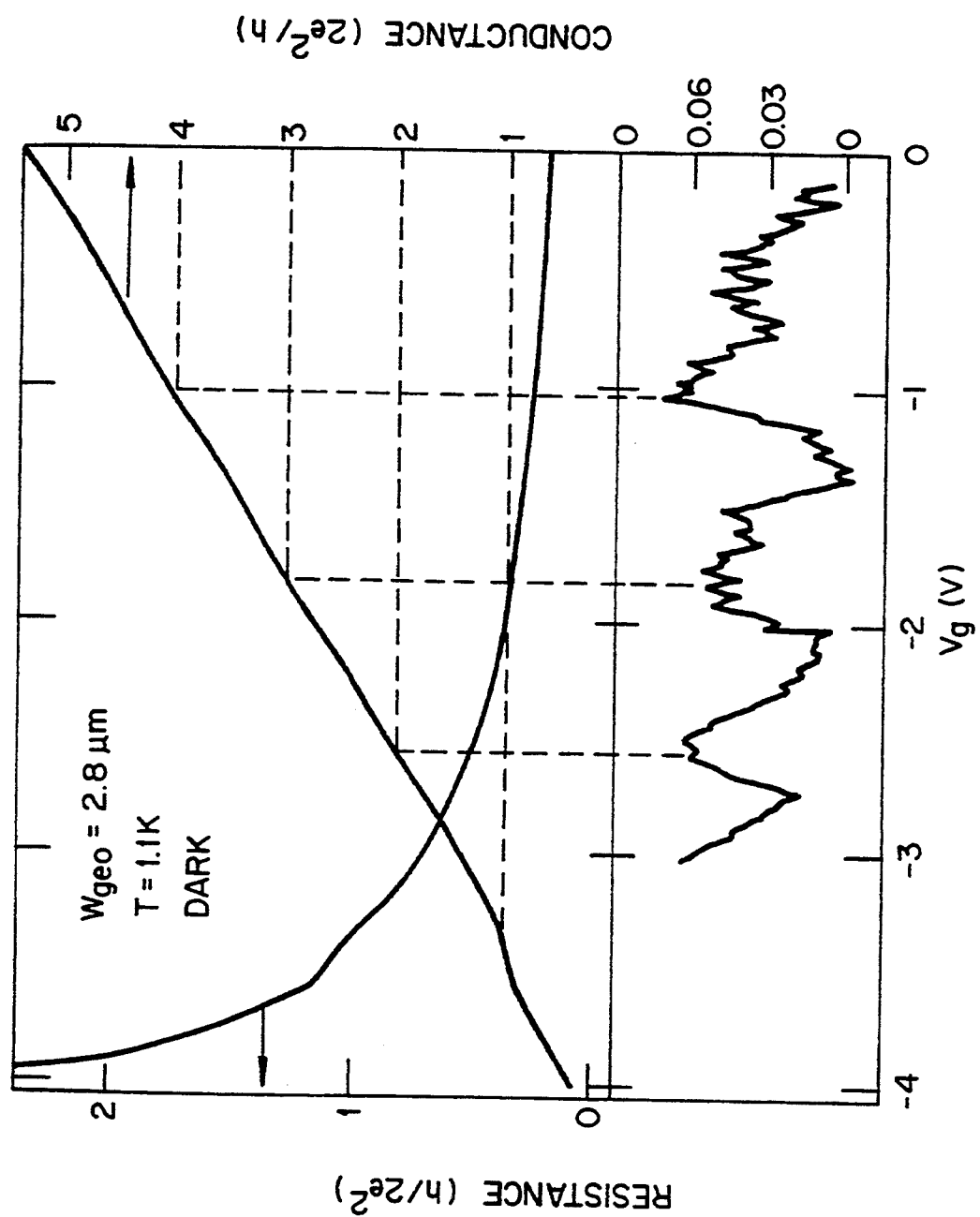

The resistance or the conductivity of the IPG channel is shown in FIG. 10 as related to the gate potential $V_g$, where the $w_{geo}=2.8μ$. FIG. 10 corresponds essentially to FIG. 5 but was however recorded with a somewhat more sensitive measuring apparatus at the temperature of 1.1K, and indeed with an FET with a construction in accordance with FIG. 1 and insulating regions in accordance with FIG. 8. The conductivity is essentially proportional to $V_g-V_{th}$, with $V_{th}$ being the cut off potential of $-4.1$ V at which the channel is completely cut off (insulating). At low temperatures as in FIG. 10 equidistant structures are however superimposed on this straight line and occur at an integral multiple of the elementary conductivity of $2e^2/h$. This observation is a proof of the fact that a considerable part of the electrons which pass through the channel do so ballistically i.e. do not experience any scattering at dislocations or phonons. This shows that the high quality of the starting structure was maintained in the channel region during FIB structuring. The transport takes place through m one dimensional sub-bands in the channel and m can be varied in the FIG. 10 between 1 and 4. In order to better resolve these structures for $m \geq 2$ which can arise through ballistic transport in one dimensional sub-bands the difference between the measured conductivity and a theoretical straight line is recorded in the lower part of the FIG. 10 with an enlarged vertical scale. The channel length is of the order of magnitude of the radius of curvature of the coulomb potential formed by the gate, i.e. a few $\mu$m. Thus it is understandable that the quantisation steps are not as sharply resolved as in short channel geometries.

These ballistic effects are only observed at temperatures of $T \leq 0K$ and source drain potentials $V_{SD} \leq kT$. The IPG transistor is however also capable of operating in the classic boundary case at substantially higher temperatures T and indeed at source-drain-potentials $V_{SD} \gg kT$. FIG. 11 shows drain current-$V_{SD}$ families of transistor characteristics of the FET of FIG. 8 for $-1 \text{ V} \leq V_{SD} \leq 1 \text{ V}$ and $T = 77K$ at different $V_g$, with $w_{geo}$ here being 4.2 $\mu$m. The channel is "normally on" (i.e. conductive at $Vg = 0$ V) and can thus be enhanced with positive $V_g$ and depleted with negative $V_g$. At $V_g = -4$ V the channel is practically insulating. The family of characteristics is symmetric about the zero point since $V_{SD} \leq V_g$. At $V_g = +5$ V the channel resistance amounts to 6 k$\Omega$, at $Vg = -4$ V it lies above $10^7 \Omega$.

The individual pictures of FIG. 11 can be explained as follows:

A) shows the the I-V characteristic between the gate and the channel at $-5.6 \text{ V} \leq V_g \leq 5.6$ V the gates are insulated from the channel. B) shows I-V characteristics for various positive values of $V_g$, with the centre point of the diagram being the coordinate origin. The curve with the smallest absolute ordinate values corresponds to $V_g = 0$ V, the above lying curves correspond to positive $V_g$ in respective steps of 1 V ($V_g = 0$ V, the above lying lines corresond to positive $V_g$ in respective 1 V steps ($V_g = 1, 2, 3, 4, 5$ V)). In C) I-V characteristics are shown as in B) but for negative $V_g$. The curve with the largest absolute ordinate values corresponds to $Vg = 0$ V, the lower lying curves to $V_g = -1, -2, -3, -4$ V.

Figure 12A:
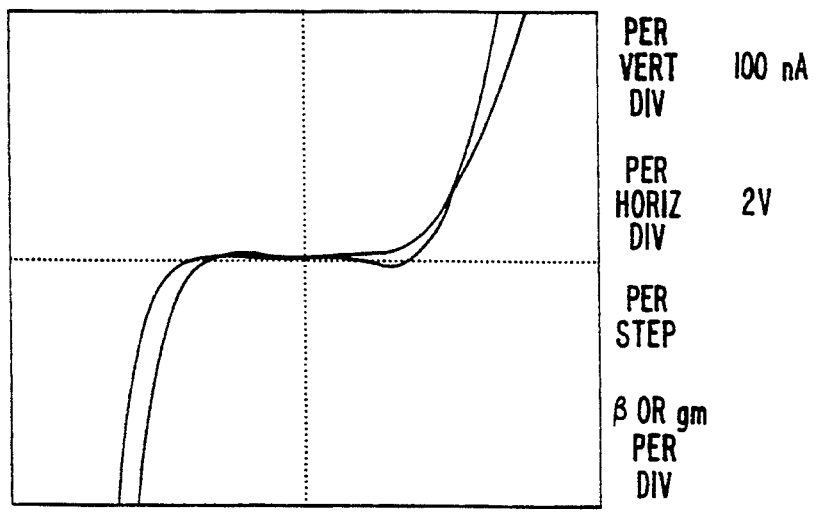
FIG. 12A–C I-V characteristics as in FIGS. 11A–C however measured at room temperature. In B) and C) the coordinate origin is in the left hand lower corner of the diagram. The double lines and slight loops are artefacts of the characteristic plotter.
Figure 12B:
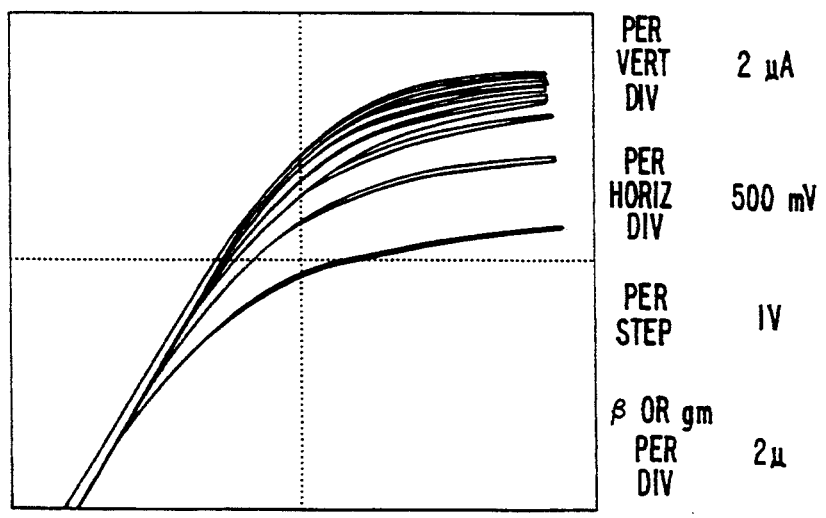
Figure 12C:
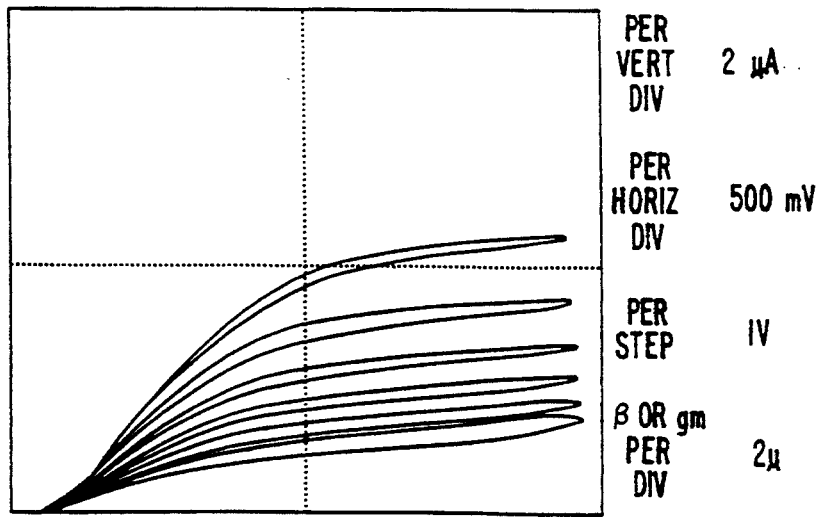

FIG. 12 shows families of characteristics for the same IPG structure, (i.e. the structure of FIG. 8, as modified for the measurements of FIG. 11), at room temperature and at larger source drain potentials $V_{SD}$ of up to 5 V, which are comparable with the applied gate potentials. In B) and C) the coordinate origin is in the lower left hand corner of the diagram. The double lines and the slight loops are artefacts of the characteristic plotter. With these results proof is provided of the fact that a transistor of this kind can drive a further transistor which is a basic requirement for its use in integrated circuits. A further technological detail are the two gates in FIG. 9 which were previously connected in parallel: for this purpose an external cross connection is necessary between gate 1 and gate 2 which can make itself disturbingly noticeable in particular with high integration. The problem can be elegantly solved in that for example gate 1 is connected to the source (by partial omission of the FIB line between the channel and the lower edge of the sample in FIG. 1). In this way the electrical potential transverse to the channel is asymmetrical, i.e. the electrons are pressed with negative gate potentials at the remaining gate 2 towards the insulating FIB line at the previous gate 1. In actual fact the characteristics in FIGS. 11 and 12 were recorded in this configuration. In addition to the realization of a true three terminal component this arrangement also has the further advantage that the crystal quality, and thus the charge carrier density n and mobility $\mu$, gradually reduce in the direction towards the FIB written barriers. In this way the electrons are displaced at negative gate potentials more and more into regions in which not only n but also $\mu$ is reduced. This modulation of the mobility makes itself notable in a change of the conductivity of the channel which does not result through charge transfer processes (speed modulation). Accordingly the response of the IPG (in plane gate) transistor is rapid and high working frequencies can be achieved. Furthermore the geometry of the IPG arrangement brings about a decisive reduction of the internal capacitances; while a conventional FET represents a capacitor of overlying layers (gate and 2DEG) the IPG transistor comprises layers which lie alongside one another (FIG. 9) which have a gate capacitance which is of an order of magnitude lower than that of a conventional FET.

A substantial strength of the IPG principle of the invention lies however not only in the tunability of the conductivity of the channel and the broad bandwidth of the frequency behaviour but rather also in the integratability of the structure. FIG. 6 has already shown a simple circuit which can be directly converted into a FIB written pattern (FIG. 7). The focussed ion beam can write IPG transistors, resistors, capacitors and inductors in one working step without stopping and these are immediately operational after they have been written. It is indeed possible to vary the depth of penetration of the ion beam with the ion accelerating potential and thus to selectively laterally structure 2DEG layers which lie at different depths, for example in order to produce cross connections. The speed of writing of the JIBL-100A ion beam writer that is used amounts to a maximum of 0.3 m/s, so that with the laboratory device which is already available, and starting with $2 \times 2$ $\mu$m large IPG transistors, one could write $10^6$ transistors in 10 s!

Having regard to the approximately 500 process steps required for conventional integrated circuit production—which must be compared with a single step for integrated IPG circuits—the sequential writing with a focussed ion implanter even becomes attractive for production. Moreover, complex IPG circuits can also be generated with conventional large area ion implanters with masks. The possibility of manufacturing a highly integrated chip in microseconds makes it possible to understand the relevance of ion implantation for the future manufacture of microstructures.

FIG. 13A shows a possible configuration of the insulating lines 30, 32 which determine the gate regions. With a long channel 44 and a larger source—drain potential, a potential drop arises along the channel (direction x) which is shown in FIG. 13B. If one now considers the value $V_g - V$ as a function of x (FIG. 13C) then it is evident that the E-field at the drain end of the channel is greater than at the source end, so that the current distribution in the channel is not uniform but rather exhibits a constricted "pinch-off" behaviour as shown in FIG. 13D. This is undesirable since it could lead to local overheating and premature failure of the component or of the circuit. In order to provide help here the arrangement of FIG. 14 is preferred. Here the "pinch-off" behaviour is controlled by the use of an approximately trapezoidal channel 44 which diverges in the direction of the potential gradient, i.e. the channel does not break away as described at its upper end but is instead uniformly narrow over its entire length. In this way "hot" regions at the end of the channel are avoided at highly negative gate potentials near to the cut off potential $V_{th}$. The trapezoidal shape (linear processing) only brings about a coarse homogenization of the current density in the channel and other shapes (hyperbola, 1/x, exponential $e^x$ etc.) offer better effects. All variants lead to a diverging shape in the direction of the potential gradient. This model actually only applies for a particular working voltage $V_o$. With deviations from $V_o$ it is less ideal but is still much better than without broadening over the length x.

FIG. 14 shows therefore an alternative shape for the gate regions with a diverging shape in the direction of the potential gradient which in practice has a substantial advantage over a rectangular shape. The illustrated "pinch-off" behaviour modelling by trapezoidal (or more complicated channels) also functions with a one-sided gate (three terminal device).

Figure 15:
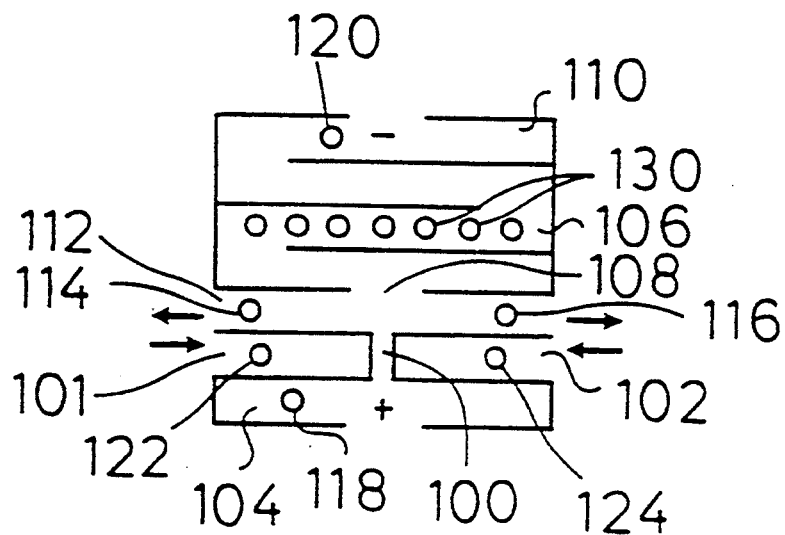
Figure 15:
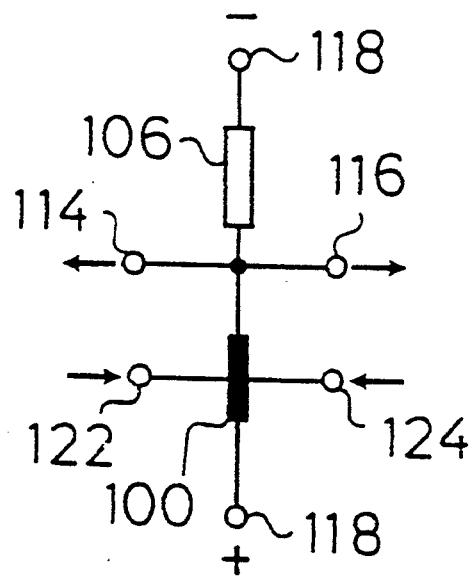

FIG. 15A shows an example for an OR-gate which can be realized in accordance with the invention, for example as part of a highly integrated circuit (LSI). The equivalent circuit diagram is shown in FIG. 15B. The line guidance for the insulating regions is so selected that a channel 100 is formed between two gate regions 101, 102. Beneath the channel 100 there is located a connection region 104 which is connected to a positive terminal of a voltage source. Above the two gate regions 101, 102 there is located a meander-like resistance path 106 which leads from a start 108 lying opposite to the mouth of the channel up to a region 110 which is connected in operation to a negative terminal of the potential source. The region 112 between the channel 100 and the input 108 is contacted at two positions 114, 116 and these equivalent contacts, which represent two alternative equal value output terminals of the OR-gate, always have the same potential. In a corresponding manner the regions 101, 102, 104 and 110 are provided with respective contacts 122, 124, 118 and 120. For the sake of the representation the side edges of the square chip are not drawn in at the level of the gate regions 101, 102 or at the level of the output region 112.

In order to facilitate the association of the contacts to the equivalent circuit diagram of FIG. 15B the connection sources in the equivalent circuit diagram are provided with the same reference numerals as in FIG. 15A. All black regions are produced by insulating writing with the exception of the side edges of the chip. When the OR-gate represents only one component on a chip then it can for example be produced in such a way that the square framing is closed at all sides apart from the positions where connections takes place to other components. For this reason no insulating regions are shown at the sides of the component at the level of the two gate regions 101, 102 and of the output region 112. It is naturally not necessary when using the component on one chip to individually contact these regions since as a general rule the potential supply to these regions or the potential take-off from these regions takes place via connections to other components, i.e. via the two dimensional charge carrier layer.

If no potential is applied to the regions 101, 102, then the input region 104 is connected with the output region 110 via the region 106 forming the resistor, so that the channel 100 and the resistor region 106 form a potential divider and the corresponding potential is externally accessible at the contacts 114, 116. As the resistance of the channel in the open state is very low, in practice the potential in the drain region 112 corresponds to the source potential. If however a control potential is applied to the region 101 and/or to the region 102 then this control potential serves to completely block the channel region 100, so that the potential in the region 112 corresponds to the potential prevailing in the region 110. I.e. the application of a potential to one or more of the two gate regions changes the output potential from high to low so that the function of an OR-gate is present. In FIG. 15B the resistance which corresponds to the region 106 is likewise characterized by the reference numeral 106 and the channel 100 is drawn in with the solid vertical line which for easy comprehension likewise carries the reference numeral 100. One can imagine this solid line 100 or the channel 100 in such a way that it is formed by two FETs the gate electrodes of which are connected together.

Figure 16:
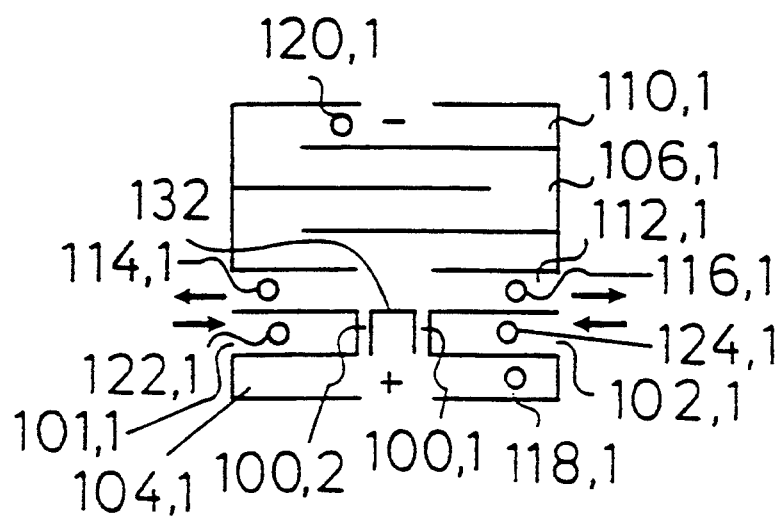
Figure 16:
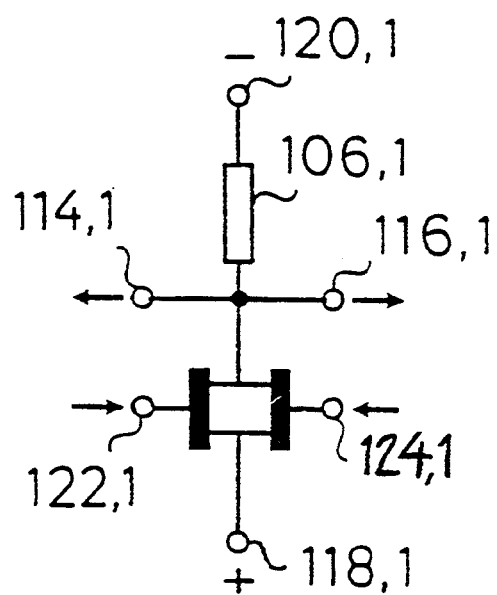

FIG. 16A shows an AND-gate 130 with FIG. 16B showing the equivalent circuit diagram for this AND-gate. One notes that the construction of the AND-gate is similar to that of the OR-gate which is why the same reference numerals have been used for corresponding regions, however with the addition of 0.1. In distinction to the OR-gate of FIG. 15A two channel regions 100.1 and 100.2 are however provided here, which are respectively formed between one of the electrode regions 101, 102 and a central n-shaped insulating line 132. If a controlled voltage is applied here to one of the contacts 122.1 or 124.1 then only the respectively associated channel 100.1, 100.2 is closed whereas the other channel remains conductive and the component act as a potential divider so that a corresponding potential is externally accessible at one or more contacts 114.1, 116.1. If in contrast control signals are applied to the two gate regions 100.1, 102.1 then both channels 100.1, 100.2 are depleted and the potential in the region 112.1 corresponds to the potential in the region 110.1. From this description one can see that the component functions as an AND-gate. In the equivalent circuit diagram of FIG. 16B one can also imagine the two channels 100.1, 100.2 as if they were formed by two FETs which are connected together source to source and drain to drain.

As mentioned in connection with FIGS. 15A and 16A the components function in the conductive state as a potential divider. The resistance 106 is chosen so that it is substantially larger than the resistance of the channel 100 or of the channels 100.1, 100.2. In this way the potentials in the region 112, or in the region 112.1 respectively correspond to the positive supply potential in the region 104 and 104.1, so that a whole series of such gates can be linked up in a chip without pronounced voltage losses arising.

Instead of the resistor 106 or 106.1 being formed by a meander-like path, which leads to inductivity, one can also place a series of insulating regions or "stones" into a conductive region by means of the ion beam, as for example shown at 130 in FIG. 15A, whereby the resistance of this region is thereby increased.

Figure 17A:
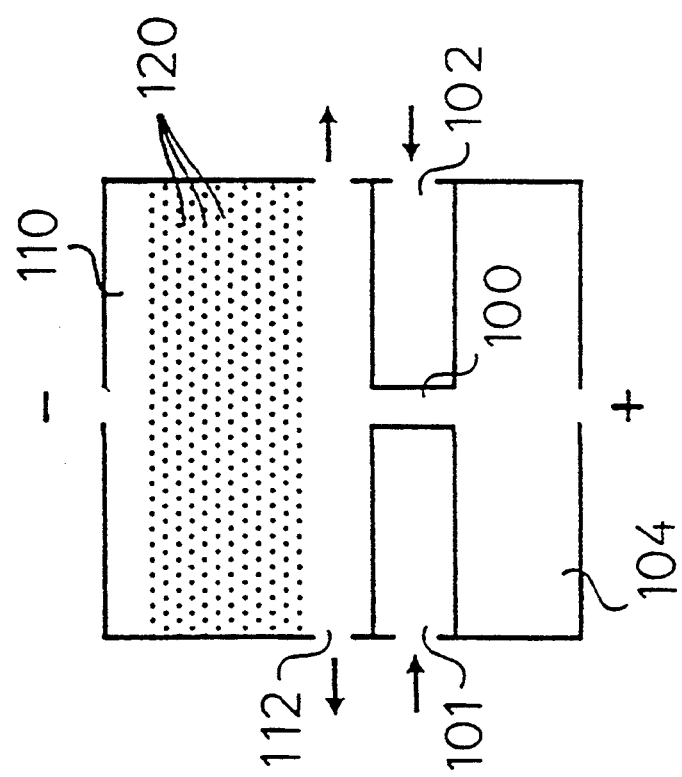
Figure 17B:
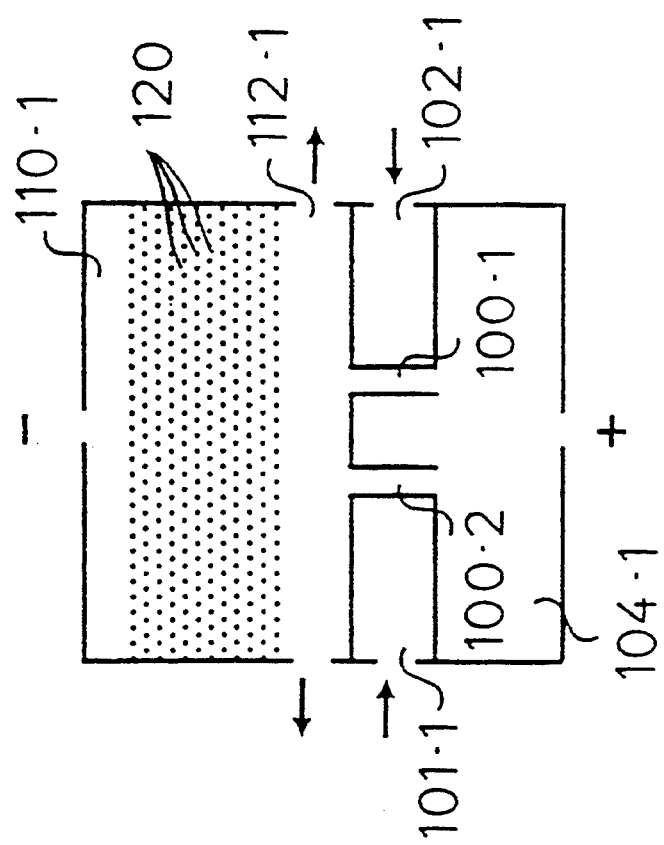

In practice many many more "stones" 130 are necessary and they are placed in accordance with a point array onto the chip in accordance with FIG. 17A and 17B in place of the meander-like path.

With this description it has been made clear that one can also straightforwardly produce logic components by means of the invention. Actually one can also form any other known kind of gate by a suitable line guidance of the insulating regions and can also combine such gates with one another on one chip in order to generate an integrated or highly integrated circuit (LSI), which can naturally also be equipped with other active and passive circuit elements which can likewise be manufactured by means of the method of the invention.

As already mentioned it is not absolutely necessary to form the insulating regions with a sharply focussed ion beam, but rather one can form a mask by photolithography and then expose the base structure in accordance with FIG. 1 by means of an extended ion beam through the mask in order to achieve corresponding linear destruction. In so doing the mask can either be a separate thin metal foil which is laid on to the surface of the chip or it can be produced on the surface of the chip itself by photolithography. The apertures in the mask correspond in position and layout to the desired lines of insulation on the chip.

At all places where the FIB beam does not directly bound the channel (touch it) a substantially broader FIB line can be written in order to improve the electrical break-through behaviour at the large gate potentials and to reduce the total capacitance of the gate or gates relative to the source and drain.

As can be seen from the foregoing the main idea of the previous proposals in EP 0 394 757 is that starting from a layered two-dimensional electron system (2DES), a narrow quasi-1D (Q1D) channel is insulated laterally from 2DES regions, which serve as gates. The conductivity in the Q1D channel is controlled via a gate voltage, $V_g$, which is applied between the channel and adjacent 2DES regimes. This in-plane-gate configuration has the inherent advantage of very low capacitance in comparison with conventional sandwich type surface gates and of a simple and fast one-step-patterning technology. The original proposal in which the insulation was achieved by focused-ion-beam(FIB)-bombardment is also described in reference [1] (see the last page of the present description).

Figure 18A:
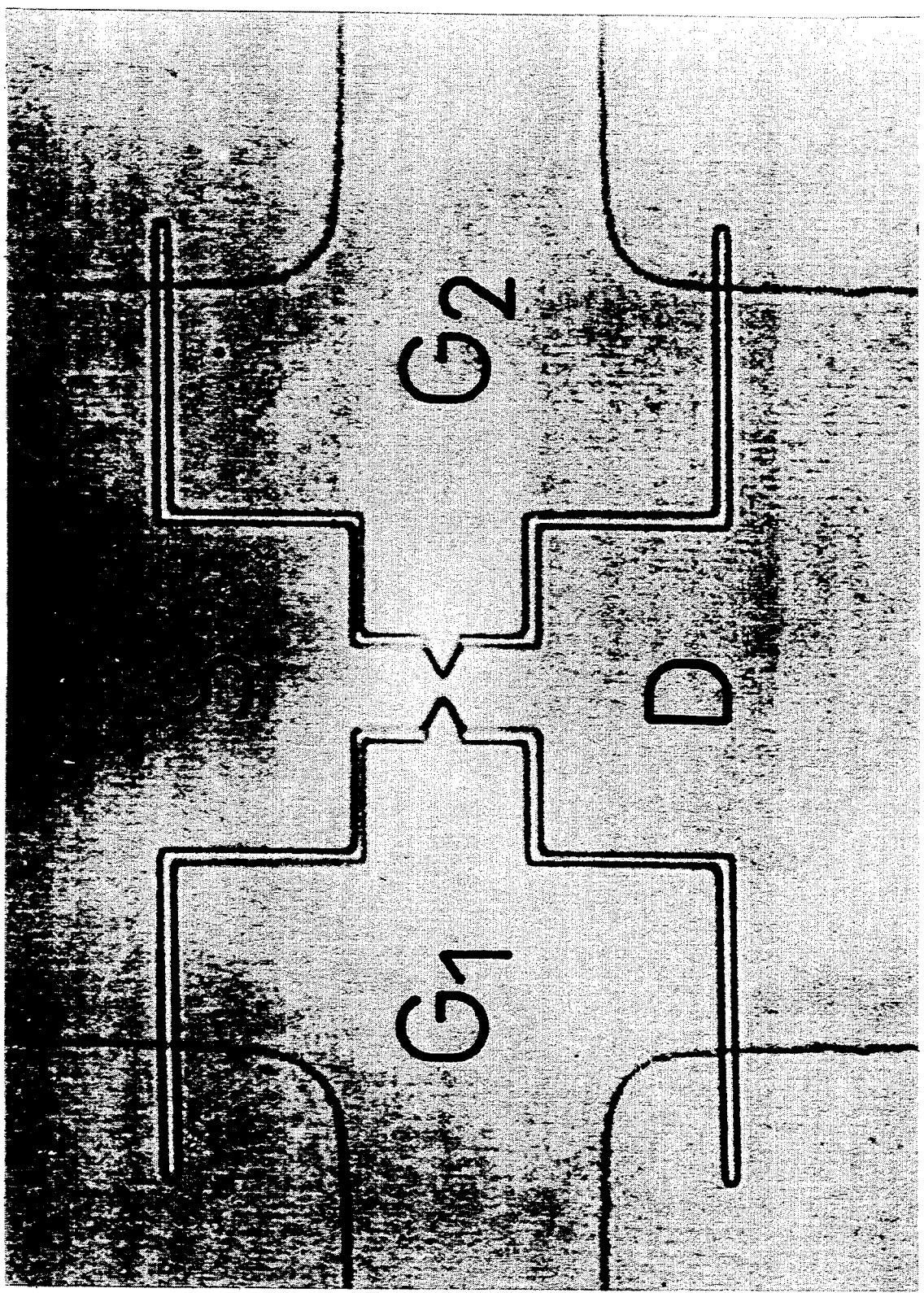
FIG. 18 A) Optical micrograph of a deep mesa etched in-plane-gate transistor. B) Scanning-electronmicrograph of the electron resist pattern before the RIE process showing a magnification of the central part of FIG. 18A. C) Scanning-electron-micrograph of the constriction after the RIE and the resist-stripping process. D) Schematic left-to-right cross-section of the constriction. The dashed lines in FIG. 18D indicate schematically, where the gate voltage $V_g$ is applied.

The present application relates first of all to a further development of the original proposal in which deep mesa etched trenches electrically insulate the Q1D channel and the 2DES-gates, i.e., vacuum (or air) serves as the dielectric for the controlling electric field. In this respect it may be of interest to refer to reference [2] (see the last page of the present description) which relates to vacuum insulated sandwich-type top gates. Such a deep mesa etched in-plane-gate in accordance with the present proposal is sketched in FIG. 18D. The realisation of such a device requires the use of sophisticated optimised deep mesa etching processes, such as are described in references [3, 4], which make it possible to produce very narrow Q1D channels without carrier trapping and mobility degradation.

The starting point for the devices on which the investigations have so far been concentrated using deep mesa etching are MBE-grown modulation-doped AlGaAs/GaAs heterostructures similar to the heterostructures of FIG. 1 but with the following parameters: semi-insulating GaAs substrate, 2.1 μm GaAs buffer, 27.5 nm $Al_{x}Ga_{1-x}As$ spacer, 52 nm Si-doped ($n_D = 1 \times 10^{18}$ cm$^{-3}$)$Al_xGa_{1-x}As$ (x=0.36) and 8 nm GaAs cap layer. Mobility and carrier density at room temperature are 8500 cm$^2$/V$_g$ and $2.8 \times 10^{11}$ cm$^{-2}$, respectively. The wafer is covered with a 700 n methacrylate) layer and patterned by electron beam lithography with 25 keV electrons and 5 pA beam current in a converted scanning electron microscope. The average dose is 200 μC/cm$^2$ with spatial dose variations to correct proximity effects. The trench pattern used for investigating a single in-plane-gate transistor can be observed from the micrographs in FIG. 18A–C. More specifically, in FIG. 18A, The bright lines are the mesa etched trenches, which separate the left hand side gate, G$_1$, and right hand side gate, G$_2$, from the channel between drain (D) and Source (S).

Figure 18B:
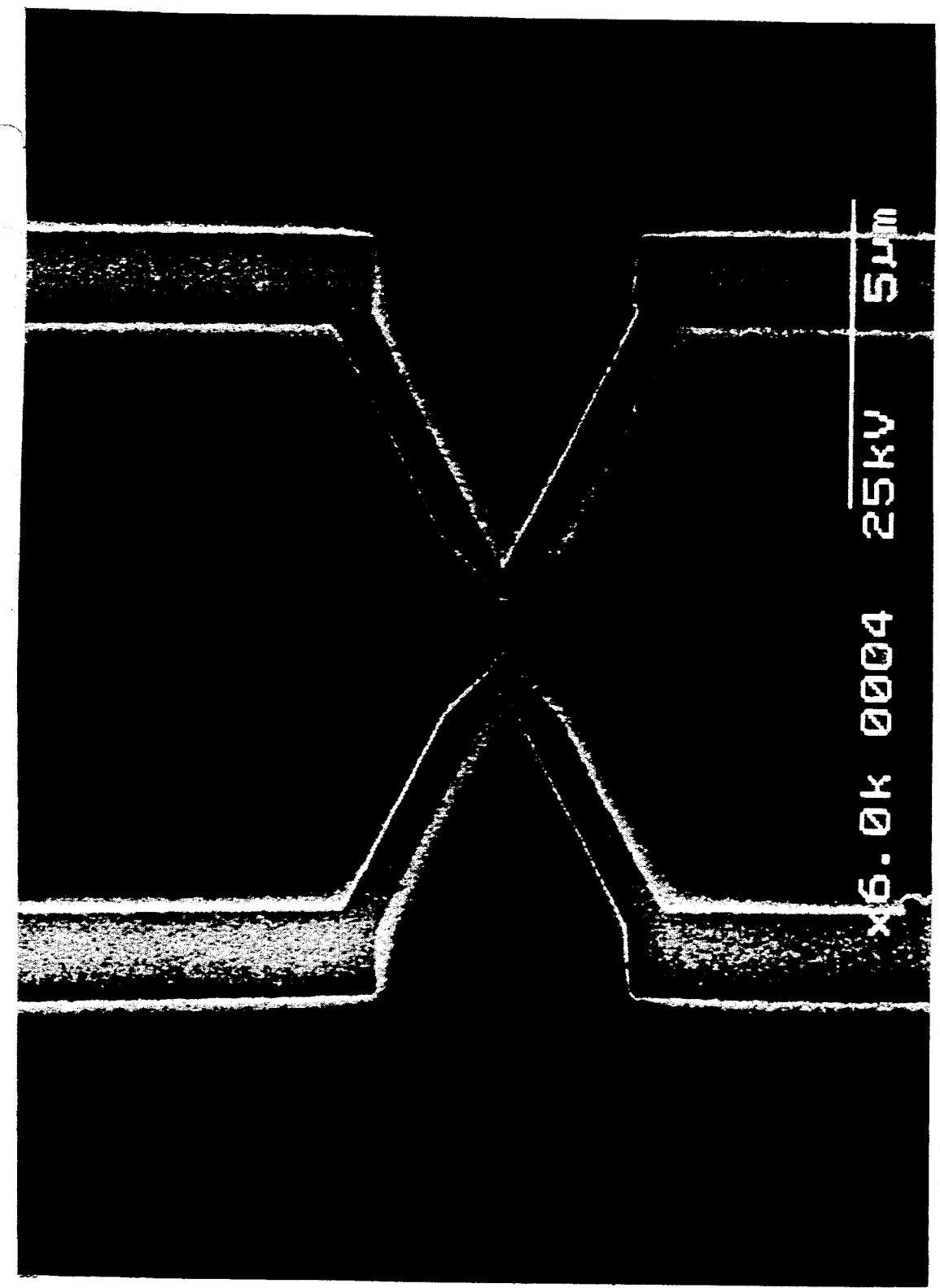
Figure 18C:
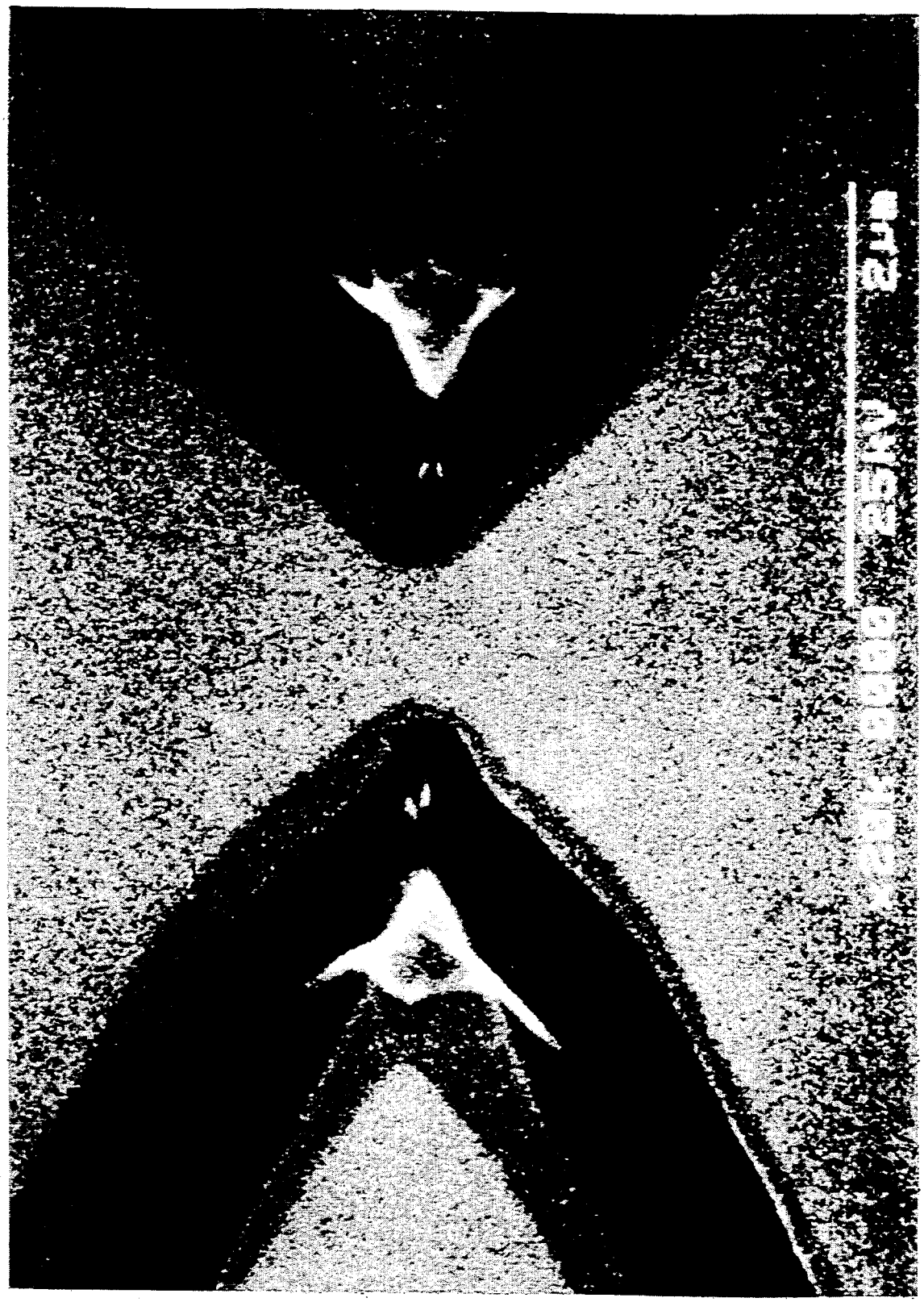
Figure 18D:
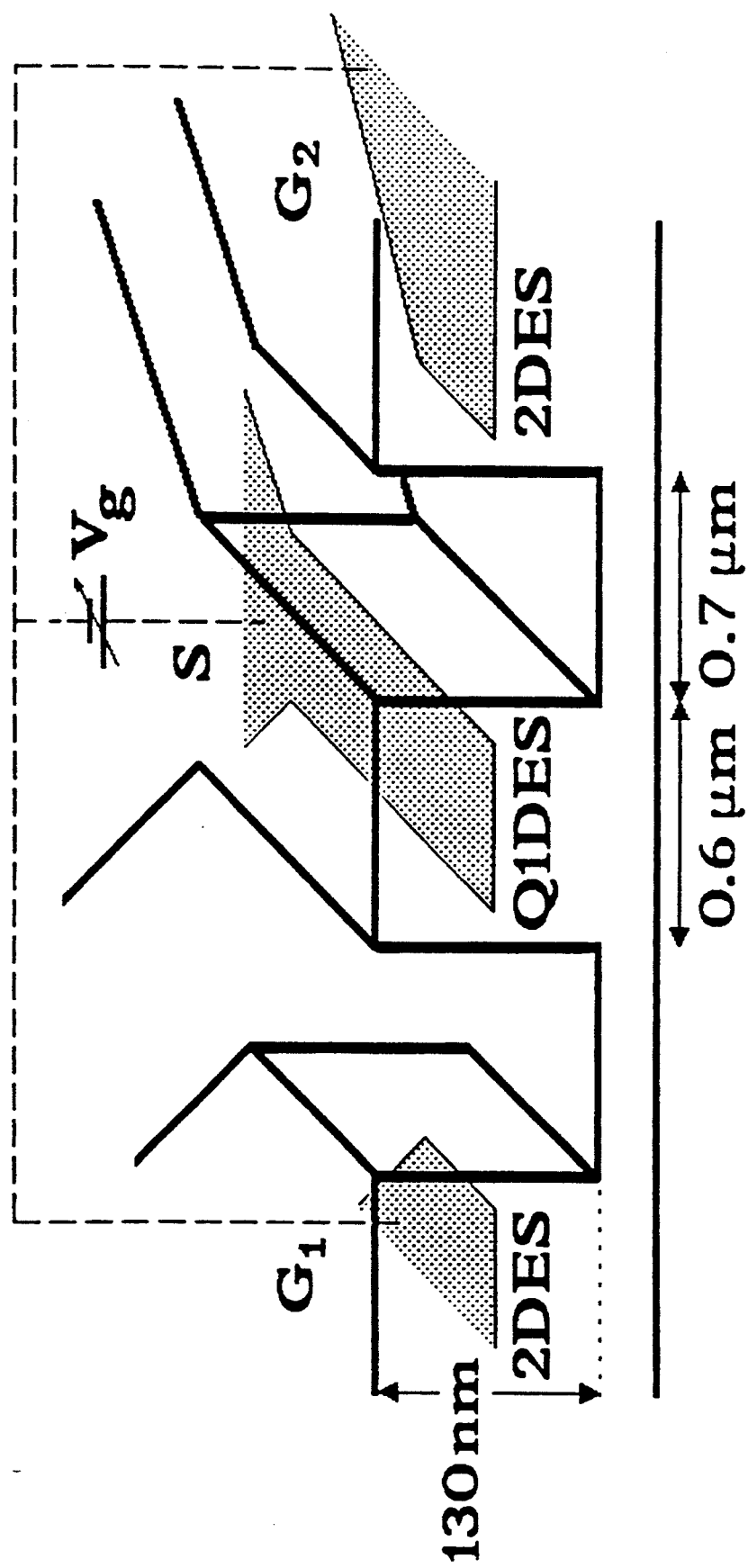

The centre portion of the trench pattern defining the channel can be seen to an enlarged scale in the scanning electron micrograph of FIG. 18B which in fact shows the electron resist pattern prior to reactive ion etching. The micrograph of FIG. 18C shows the same region with even higher magnification after reactive ion etching (RIE) and the resist stripping process. The two dark V-shaped areas are the bottoms of the deep mesa etched trenches.

The important point of the fabrication is a deep mesa etching process, where narrow, deep trenches are etched down through the active GaAs layer. This ensures a high degree of insulation between the Q1D channel and the 2DES gate regions and minimises possible leakage through the GaAs caused by residual doping. The main challenge of deep mesa etching is to avoid surface states and roughness in the free etched sidewalls which can lead to large lateral depletion of carriers and degradation of mobility. Recently it has been demonstrated that with optimised etching processes it is possible to fabricate Q1D wires with lateral geometrical widths as narrow as 500 nm with highly mobile carriers [3, 4]. It is found that the electronic width of such wires was 200 nm to 300 nm indicating lateral depletion lengths as small as 100 nm. These wires even show, at low temperatures (T=2.2K), a 1D quantum confined energy spectrum. For the etching a $SiCl_4$ reactive ion etching (RIE) process operating at 30 mTorr and at a high gas flow (50 accm) with a self-induced dc-bias voltage of 200 V. This process, which is described in more detail in [3, 4] produces very well defined steep side walls and low damage. The topography of the etched regions is shown diagrammatically in FIG. 18D.

Transistor structures were prepared with different geometrical dimensions. The following discussion relates to transistors with a geometrical channel width $W_{geo}$=600 nm, the insulating trench width is $W_t$=700 nm and the etching depth is 130 nm (see FIG. 18C, D). With typical lateral depletion of 100 nm at either channel edge [3], the electrically active channel width $W_{el}$ is estimated to be 400 nm. The dimensions of the V-shaped gate shown in FIG. 18B are 5 μm length times 3 μm baseline. As can be observed from FIG. 18b the small trench width $W_t$ is only retained near the Q1D channel region. Away from this region trenches are wider (1.4 μm) to diminish capacitance and possible leakage currents. All transistors work even at room temperature.

The operation of such a transistor at room temperature, characterised by a Hewlett-Packard HP 4145B parameter analyser, is shown in FIG. 19. The characteristic of the leakage current, $I_{sg}$, as the result of the gate voltage, $V_g$, applied between source and both gates is plotted in FIG. 19A. It shows a $I_{sg}$ of only 10 nA at $V_g$=−3 V and negligible leakage currents for gate voltages −2.5 V<$V_g$≦0 V in the depletion mode of the device. Reverse breakdown occurs at gate voltages $V_g$<−2.5 V. For $V_g$≧−2.5 V the gates can be considered as electrostatic electrodes. FIG. 19B shows the source-drain current, $I_{sg}$, versus source-drain voltage, $V_{sd}$, for different gate voltages $V_g$, $V_g$ is varied between −2.0 V≦$V_g$≦1.5 V in steps of 0.5 V including both the depletion and enhancement mode. The differential resistance at $V_{sd}$=0 V is 33 kΩ. $V_{sd}$ is swept between 0≦$V_{sd}$≦4 V. In this interval $I_{sd}$ can be tuned up to 59 μA corresponding to a 2D current density of 295 mA/mm, if one assumes an average channel width of $W_{el}(V_g=-2\ V) \approx W_{el}(V_g=0\ V)/2 \approx 20$ nm. The device operates up to a regime $V_{sd} \approx V_g$, which is important for application, e.g. device integration [1]. A nearly perfect saturation is reached at $V_{sd}=4$ V, i.e., the differential resistance rises up to 2.5MΩ at $V_g=-1.5$ V. It is believed that total pinch-off is so far limited by a residual leakage current flowing below the trenches in the GaAs buffer and substrate. To minimise this leakage current it is possible to etch deeper or to make the trenches outside the constriction region wider. Also it would be possible to use a quantum well structure, such as an additional AlGaAs barrier for better insulation from the substrate. The most interesting quantity of a transistor is the transconductance. For the device investigated a transconductance of 16 μS, was achieved which is 6 times higher than for the original FIB device described in [1]. The 16 μS transconductance in the device under investigation corresponds to a 2D transconductance of 160 mS/mm (on the assumption of a channel width of 0.1 μm in the nearly pinched-off regime). Subsequent experiments using both the focussed ion beam technique and the present etching technique has however already led to transconductance values in excess of 1000 ms/mm which compare very favourably with the best commericially available transistors. So far the experimental set-up and sample holder have not been optimised to measure the intrinsic gate capacitance accurately. Nevertheless, since it is important for possible microwave applications, it is interesting to estimate the capacitance by reference to the measured capacitances of about 1 fF on FIB-structured IPGs in [1]. The capacitance depends sensitively on the dielectric constant. Since the latter is approximately 1 in air and an order of magnitude higher in FIB-insulated GaAs; it is possible to estimate a further decrease of the capacitance to 0.1 fF in the deep mesa etched IPGs. This should lead to a lower RC time constant of 0.1 ps for typically 1 kΩ gate series resistance, promising a 10 THz cut-off frequency.

Figure 20:
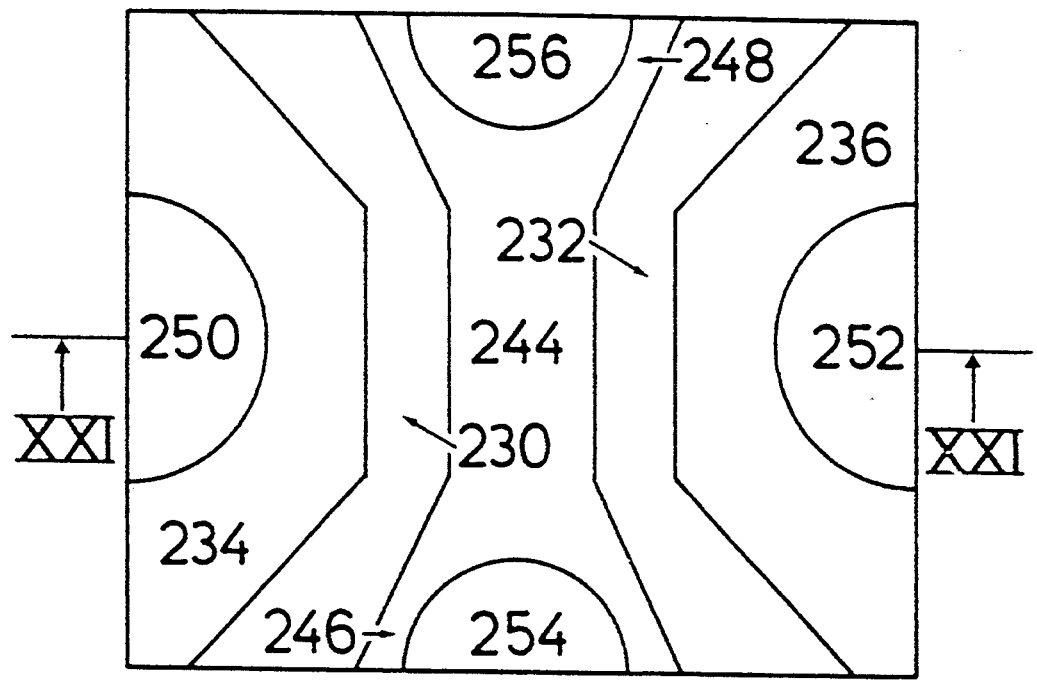
FIG. 20 is a plan view of a further in-plane-gate silicon transistor grown on a silicon substrate.

Referring now to FIG. 20 there is shown a schematic plan view of a trench-insulated in-plane-gate transistor realised in silicon.

Figure 21:
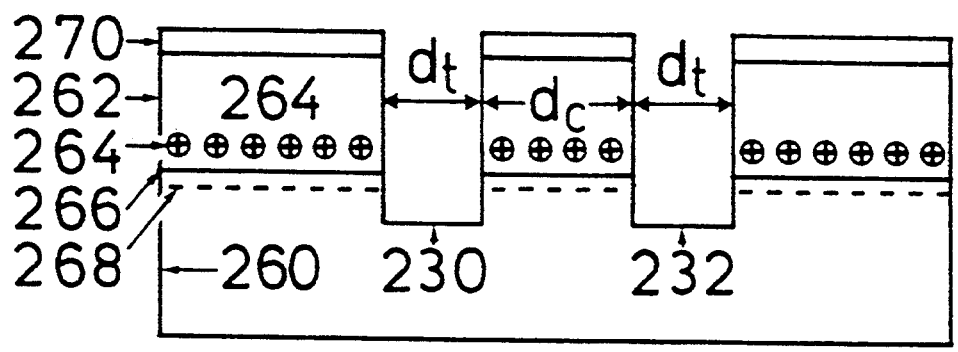
FIG. 21 is a schematic cross-section on the plane XXI—XXI through the transistor of FIG. 20 illustrating the build-up of the layered structure and the formation of the 2DEG.
Figure 22:
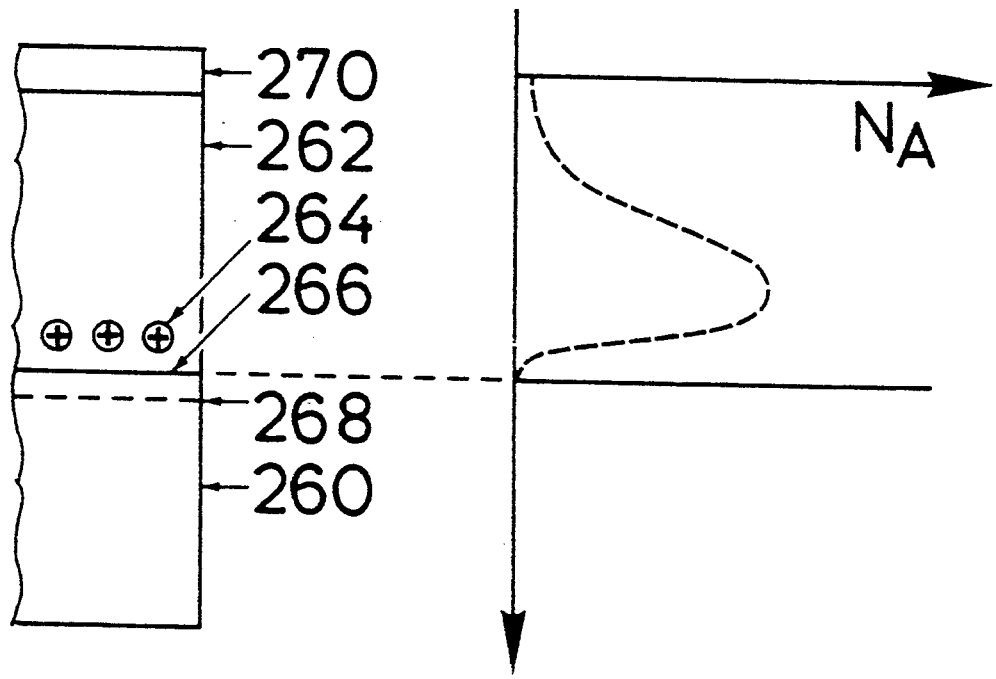
FIG. 22 is a drawing showing the distribution of the doping ions in the transistor of FIGS. 20 and 21.

In this embodiment the channel 244 extends in the usual way between source and drain regions 246 and 248 respectively. The boundaries of this channel 244 are formed by trenches 230 and 232 respectively. The region 234 to the left of the trench 230 and the region 236 to the right of the trench 232 form gate electrodes. The two gate regions 234, 236 and the source and drain regions 246 and 248 are respectively provided with metallic contacts 250, 252, 254 and 256. A cross-section through the device is shown in FIG. 21. As can be seen from FIG. 21 the device comprises a silicon substrate 260 onto which there is deposited a layer of silicon dioxide 262. Positive ions 264 are implanted into the silicon dioxide so that they lie above the boundary 266 between the silicon substrate and the silicon dioxide layer. These positive ions induce negative charges in the silicon substrate just beneath the boundary 266 and these negative charges form a two-dimensional charge carrier layer. The intention during ion implantation is to arrange the positive ions as close as possible to the boundary, but without allowing the ions to pass through the boundary. In practice a distribution of ions $N_A$ occurs in accordance with the curve shown in FIG. 22. The graph of FIG. 22 is shown alongside a reproduction of the right hand edge portion of the structure of FIG. 21 so that the charge carrier distribution can be seen in relation to the boundary between the silicon and silicon dioxide layers through the horizontal alignment of the two sketches. The silicon dioxide layer may be covered with a protective paint layer 270 in the usual manner. It will be noted that the trenches 230 and 232 which are formed by reactive ion etching extend below the level of the two-dimensional charge carrier layer 268. The metallic contacts 250, 252, 254 and 256 are diffused into the silicon substrate so that they extend through and thus make good contact with the charge carrier layer 268.

It will be appreciated that through this ion implantation so-called normally ON conditions are provided through implantation of a component charge to the oxide layer.

This is however not the only possible way of producing a two-dimensional charge carrier layer in a silicon material.

Other techniques are also known for the provision of normally ON conditions in silicon substrates, for example using techniques such as X-ray irradiation, electron irradiation, and through the use on the oxide of passive top gate materials having suitable work functions. The substrates used can be p or n silicon substrates with a desired orientation (100, 110, 101 or other) and in each case a two-dimensional electron or hole gas is formed at the boundary surface Si—SiO$_2$, e.g. through the deposition of a permanent charge in the oxide (for example as illustrated in FIG. 21) by doping, or as a result of the work function and of the top gate material.

In these structures, in similar manner to the previously described AlGaAs heterostructures, so called trenches with widths $d_t$ which are typically in the range from 50 nm to 500 nm are formed by etching or by other methods which lead to the isolation of the various regions, namely the gate regions 234, 236 and the source and drain regions 246 and 248. The width of the channel $d_c$ is typically 1:2 times the width of the trenches $d_t$. These regions are then contacted using the customary methods of silicon technology. Etching takes place using either dry and or wet chemical etching processes established for silicon technology and the masks that are required for the lithographic processes are again produced using the techniques customary for silicon technology. The source drain current $I_{sd}$ can be controlled by varying the potential at the gate 234 and/or at the gate 236.

General discussions of the well known methods for manufacturing silicon MOSFET structures can be found in the book Sze, Semiconductor Devices, Physics and Technology, published by J. Wiley in 1985.

Figure 23:
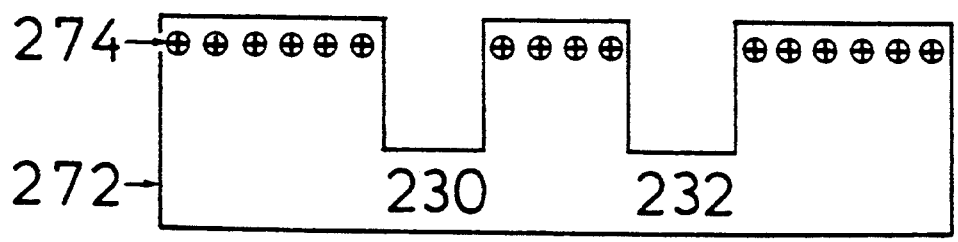
FIG. 23 is a drawing similar to FIG. 21 but showing a cross-section through an alternative, simpler, silicon semiconductor in plane gate transistor.

FIG. 23 shows an alternative and simplified semiconductor structure for realising the device of FIG. 20 on a silicon substrate. Here an intrinsic (essentially non-doped) silicon substrate 272 is used and ions 274 are implanted into the substrate to form an approximately two-dimensional ion layer. The substrate is subjected to lithography and etching in the same way as the substrate of FIG. 20 which results in the two trenches 230 and 232. The general dimensions are the same as for the embodiment of FIG. 20.

In the above embodiment of FIG. 23 the contacts are formed so that they extend through the ion layer so that a good contact to the ion layer is obtained. In this embodiment the two-dimensional charge carrier layer is formed by the ions 274 themselves, i.e. this layer functions in the same way as the two-dimensional electron gas of the previous examples. The mobility is considerably lower here, however this is not necessarily disturbing since the inherent speed of operation of such devices is high and the reduction in mobility, which would lead to a reduction in the operating speed, is not necessarily disturbing. For some applications it may indeed be desirable.

Figure 24:
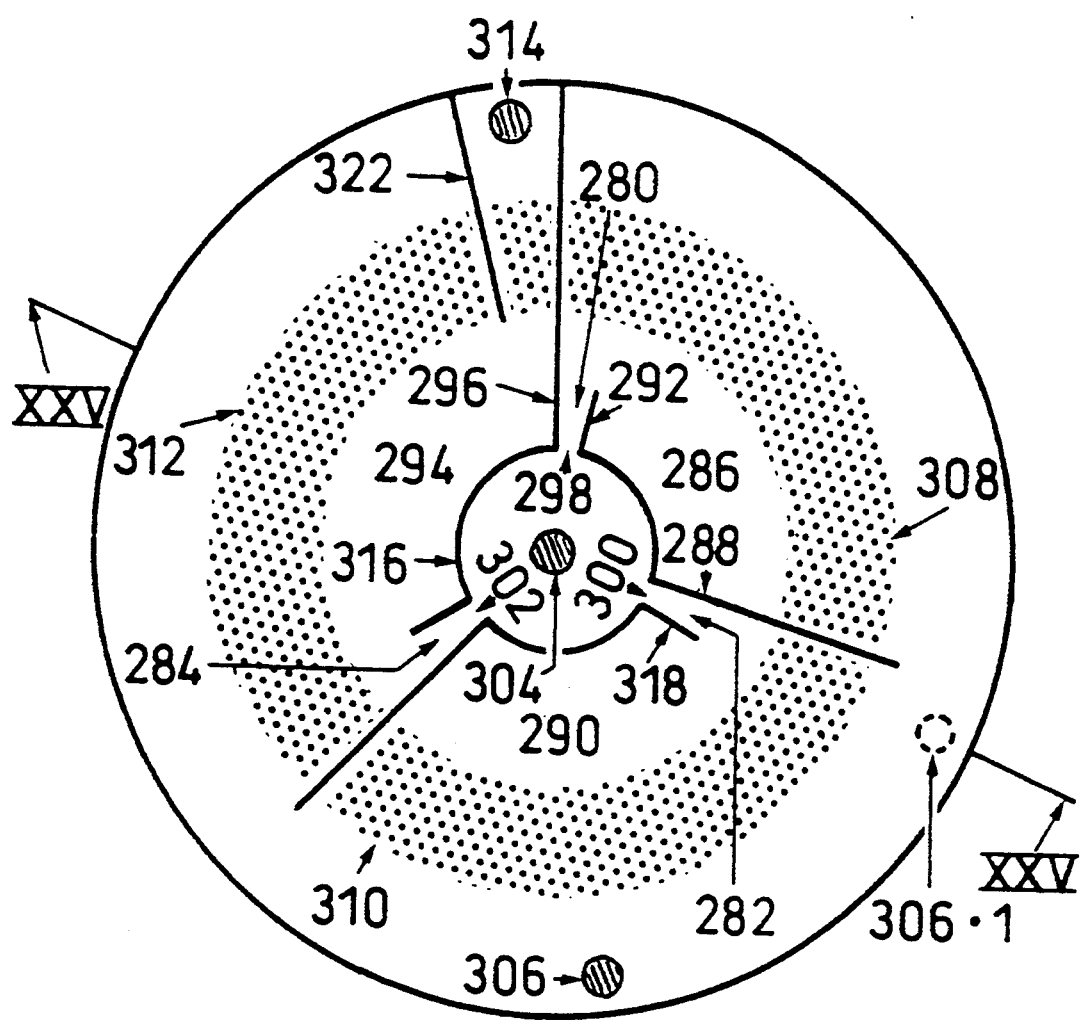
FIG. 24 is a plan view of a ring oscillator realised using the present invention (and also capable of realisation using the invention of EP-A-394,757)

FIG. 24 shows a plan view of a ring oscillator realised using the present invention. This ring oscillator could also be realised using the focussed ion beam technique of EP-A-394 757.

The ring oscillator of FIG. 24, which resembles a Mercedes star, in fact comprises three field effect transistors connected in a ring. Before discussing the structure of FIG. 24, a cross-section of which is shown in FIG. 25, it is helpful to look at the equivalent circuit diagram of FIG. 26.

It will be noted that the drain 286 of the first field effect transistor 280 is connected to the gate 288 of the second field effect transistor 282, that the drain 290 of the second field effect transistor 282 is connected to the gate 292 of the third field effect transistor and that the drain 294 of the third field effect transistor is coupled back to the gate 296 of the first field effect transistor 280. The sources 298, 300 and 302 of the three field effect transistors 280, 282, 284 are all connected to a common terminal 304 and the drains are also connected to a common line 306 in each case by a respective resistor 308, 310 and 312. Let us assume that the potential at the gate of the first field effect transistor 280 is low, so that no current flows through this transistor. The resistor is therefore highly resistive and forms a potential divider with the resistor 308 such that the potential at the drain 286 is high. As the drain 286 is connected to the gate 288 of the field effect transistor 282 the latter is conductive and the potential at the drain 290 of the transistor 282 is effectively the same as the potential at the source 300, i.e. low. This low potential at the drain 290 is then applied to the gate 292 of the field effect transistor 284 so that this transistor is again non-conductive and it forms a potential divider with the resistor 312 such that the potential at the drain 294 is high. This high potential is now coupled back to the gate of the first field effect transistor 280 so that it now changes from the non-conductive to the conductive state thus switching off the transistor 282 and switching on the transistor 284 whereupon the potential at the gate 296 of the first field effect transistor 280 is once again low and the transistor again cuts off. This process repeats itself, in other words the circuit oscillates. The frequency of the oscillation is a function of a signal transfer time through the circuit and this can be very short due to the inherently low capacitances of this design. This capacitance is so low that oscillations in the Terahertz range are expected even at room temperature and can rise to the hundred Terahertz range at very low temperatures of a few degrees Kelvin. It is not essential to use three field effect transistors. The circuit will in fact operate in the desired manner with any odd number of field effect transistors, including a single field effect transistor. The more field effect transistors that are used the lower is the frequency of oscillation. In fact, it would be difficult to conceive of a measuring circuit which could be used in the frequency range discussed to measure the speed of oscillation of this circuit. For this reason people were interested in high oscillation frequencies, build ring oscillators having many stages so that if n is the number of stages the oscillation frequency of the circuit is n times lower than that of a comparable oscillator comprising just one stage. Using this technique one can measure the frequency of oscillation of an n stage ring oscillator using a calibrated measurement circuit and can accurately estimate the frequency of oscillation of a lesser number of stages by dividing by the appropriate figure.

Figure 25:
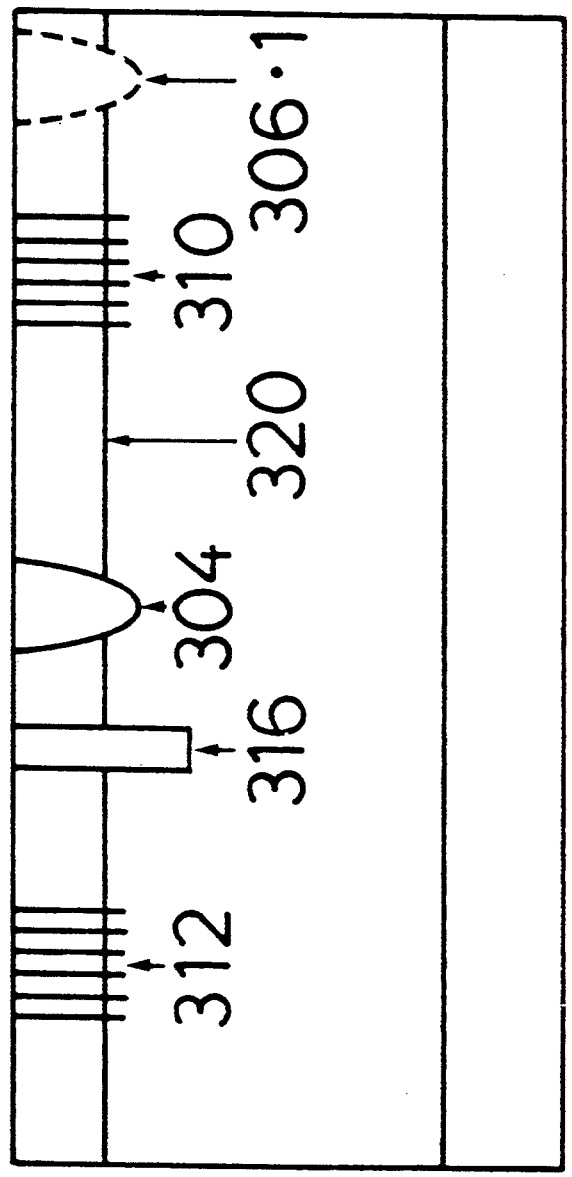
FIG. 25 is a cross-section through the ring oscillator of FIG. 24 in the plane XXV—XXV.
Figure 26:
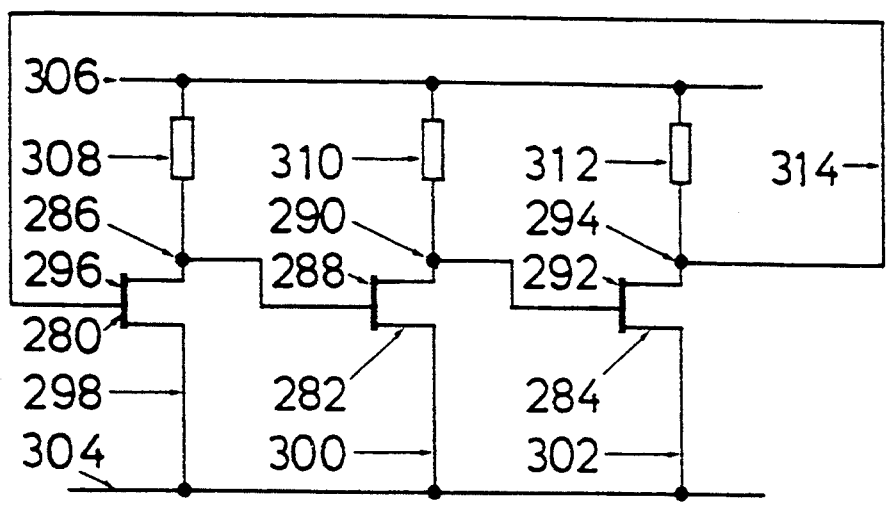
FIG. 26 is an equivalent circuit diagram of the ring oscillator of FIG. 24.

The physical construction of the three stage ring oscillator of FIGS. 24 and 25 can now be seen from these figures in which the same reference numerals have been inserted as have been used in FIG. 26.

The solid black lines denote the potential barriers which can be formed either by destroying the crystal structure by ions (through for example the focussed ion beam technique or through a mask as described in EP-A-394 757) or which can be formed by lithography and etching as in the present proposal. In order to make the cross-section of FIG. 25 more easily understood the reference numeral 316 has been entered to show the section through the correspondingly numbered potential barrier of FIG. 24 which is realised in the specific cross-section of FIG. 25 as an etched trench.

The resistors 310 and 312 shown in the drawing of FIG. 24 correspond to the "stones" 130 of FIGS. 17A and 17B and are formed by ion bombardment. They could however also take the form of meander-shaped resistive paths which could be formed by lithography and etching.

The contacts 304 and 306 which are shown in FIG. 24 as filled in black circles correspond to the potential supply lines 304 and 306 of FIG. 26 and are of course the terminals where potential is applied to the circuit. The precise positions of these contacts is non-critical since they make contact with the two-dimensional charge carrier layer. Thus the contact 306 could for example be located at the position 306.1 shown in FIG. 24 in broken lines. The equivalent contact is then shown in FIG. 25.

The terminal 314 of FIG. 24 (which cannot be seen in FIG. 25) corresponds to the line 314 of FIG. 26 connecting the drain of the third field effect transistor 284 to the gate 296 of the first field effect transistor 280 in the equivalent circuit diagram It thus also represents the contact at which the oscillation would in practice be detected (for example between the terminals 304 and 314).

In the representation of FIG. 24 the potential barriers which divide up the structure each finish in a tail such as 318 adjacent the conductive channel of the respective FET. The length of the tails such as 318 is non-critical and can be varied as desired, in particular they can be made much shorter than shown here. Indeed it can be made of zero length, the arcuate portion of the potential barrier preceding it being sufficient to define the conductive channel. The shorter the tails 318 are, the higher the frequency at which the ring oscillator will oscillate.

The outer circle bounding the device of FIG. 24 could either be the boundary of the chip (which need not be circular) or could simply be a circular potential boundary formed on the chip by any one of the described techniques, typically by lithography and etching. Finally, the potential boundary 322 shown in FIG. 24 as a radial line is necessary to ensure a uniquely defined potential at the terminal 314.

So far as the cross-section of FIG. 25 is concerned it will be appreciated that the actual semiconductor material can be realised in any of the ways already described in the present application, or indeed in other ways providing the clear two-dimensional charge carrier layer 320 is achieved. In particular the layer arrangement could correspond to the layer arrangement of FIG. 1 of the present application, or to the modified arrangement described immediately prior to the description of the micrographs of FIGS. 18A to C. Moreover, the structure could also be a silicon structure, for example in accordance with FIGS. 21 or 23 of the present application.

The realisation of an FET structure in accordance with FIG. 20 using etched trenches for the potential barriers, and more particularly for the potential barriers adjacent the channel region of the transistor means that these channel regions are open and can receive substances to be detected, in particular when the substances are in the form of a liquid or better still a gas. It is also quite clear that the presence of different substances in the trenches will give rise to different measured characteristics of the devices, such that the substances can be detected by detecting the relevant characteristics. The characteristic could be any characteristic typically measured for a transistor, such as for example the shape of the drain current/drain voltage characteristic at constant gate voltage.

Since a circuit will be need to detect the particular characteristic this circuit could conveniently be integrated onto the chip and formed by the same techniques as the transistor itself.

Figure 30A:
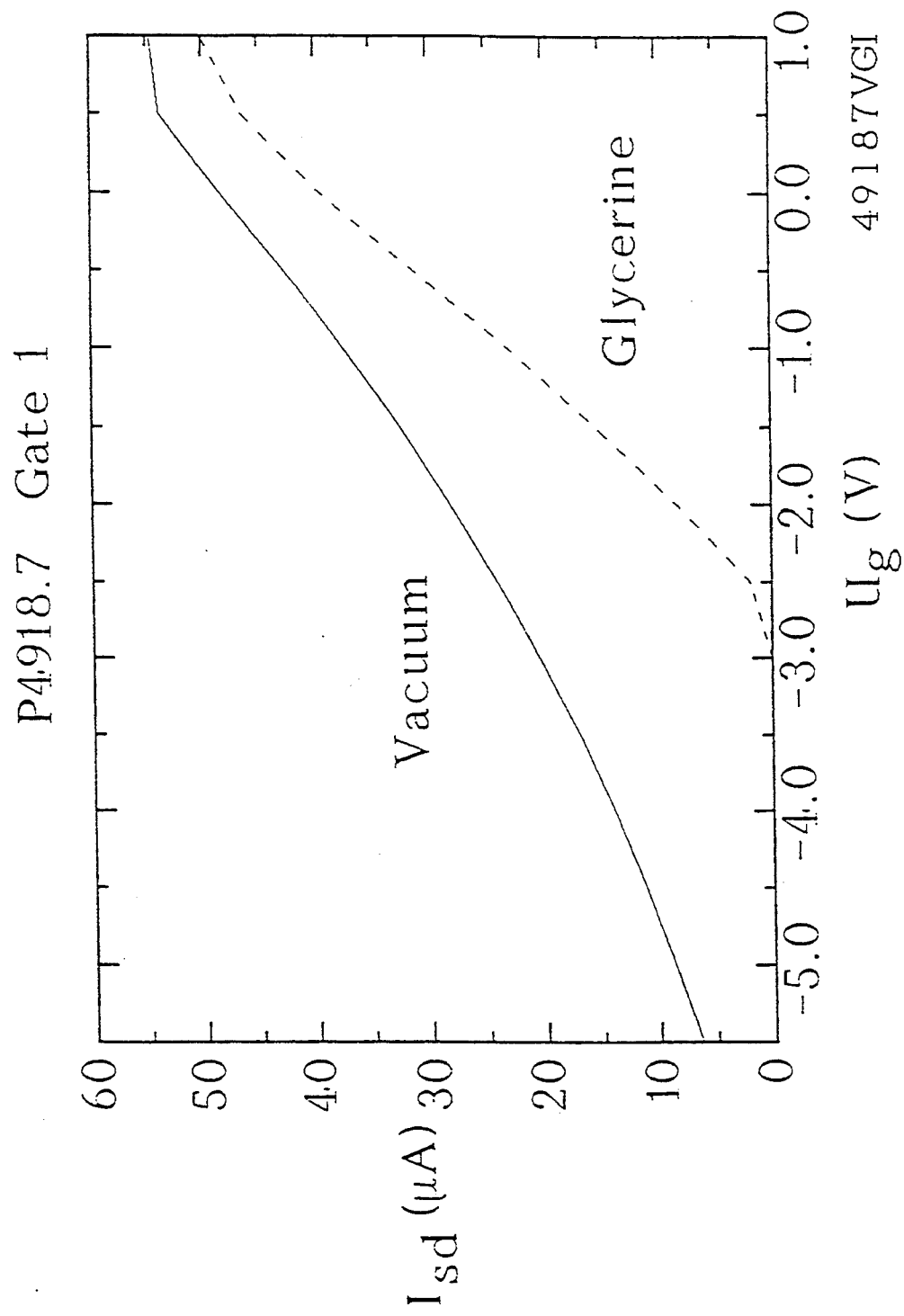

By way of illustration FIG. 30A shows the source drain current of a sample FET as a function of the applied gate voltage using a structure with etched trenches. The straight line curve shows the characteristic obtained in vacuum when the dielectric constant in the trenches is equivalent to the permittivity of free space. The graph of FIG. 30A also shows a second broken-line curve which applies to the case in which the trenches are filled with glycerine which has a higher dielectric constant. It will be noted that there is a sizable shift in the characteristic, and this sizable shift can be used to detect the presence of, in this case, glycerine.

Figure 30B:
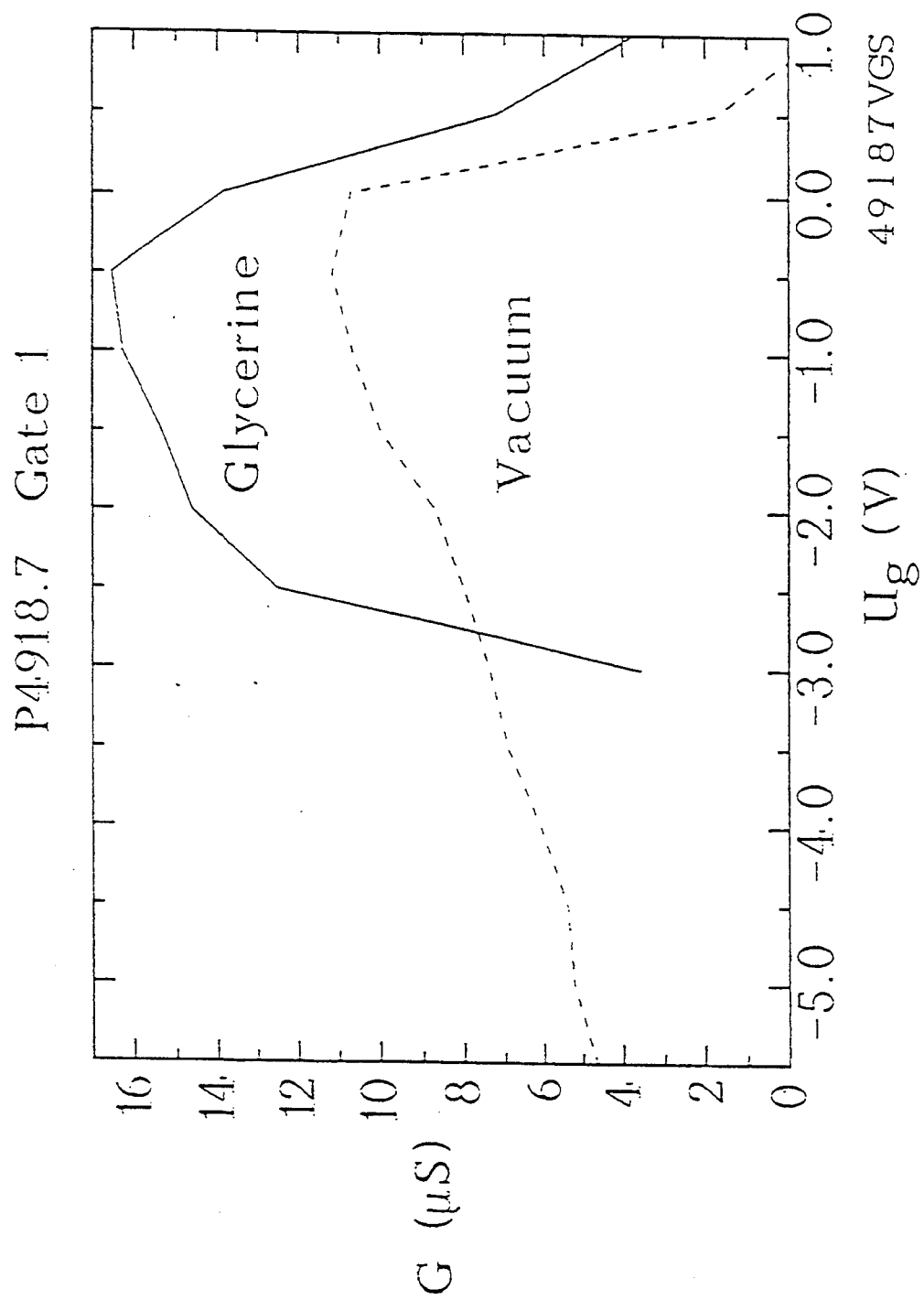

For the DC case there is also the possibility of measuring the transconductance G in micro $\mu$S as a function of the gate voltage. FIG. 30B shows the two plots for glycerine and vacuum for the same sample FET as was used for FIG. 30A. Here the transconductance for glycerine is shown as a solid line whereas that for vacuum is shown as a broken line. It will be noted that the peak transconductance for glycerine is almost double the peak value obtained for vacuum and this again provides a very sensitive measure of the substance present in the etched trenches. It should be emphasized that this is here simply a DC measurement there is no need to look at complicated frequency responses. Moreover, the described measurement can readily be carried out at room temperature, since devices of the present invention function at room temperature. This example also conclusively shows that the performance of FET's can be improved by filling the trenches with suitable materials, typically dielectrics.

Whilst a detector of this kind is entirely feasible, in particular when one is checking for the presence of one of a few possible substances, it is believed that a better detector can be made using the ring oscillator of FIG. 24. In such an arrangement it is desirable to sweep the frequency of oscillation of the oscillator formed with open etched trenches. Detection is effected by analysing the frequency response characteristic that is obtained over the range of interest. This embodiment exploits the fact that substances, in particular liquids and gases have certain very specific frequencies at which the molecules and atoms in the structure oscillate and oscillators formed in accordance with the present invention should be able to oscillate at the frequencies of interest.

Figure 27:
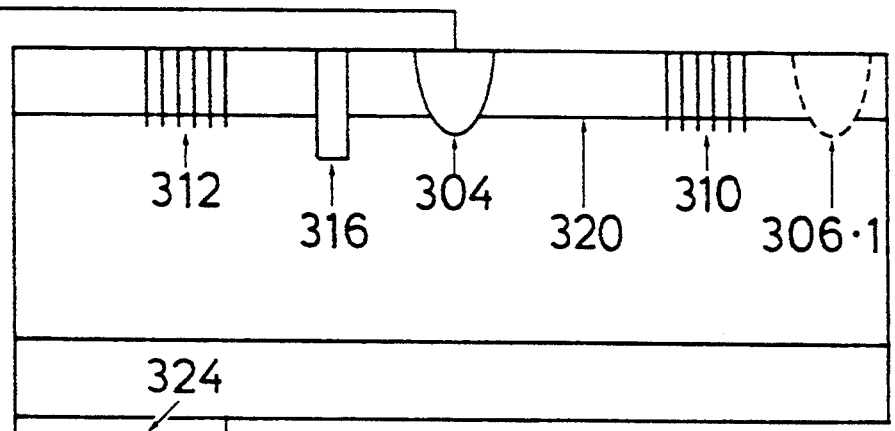
FIG. 27 is a cross-section through a ring oscillator similar to that of FIG. 24 but provided with a back gate to enable the frequency of the device to be varied.
Figure 28:
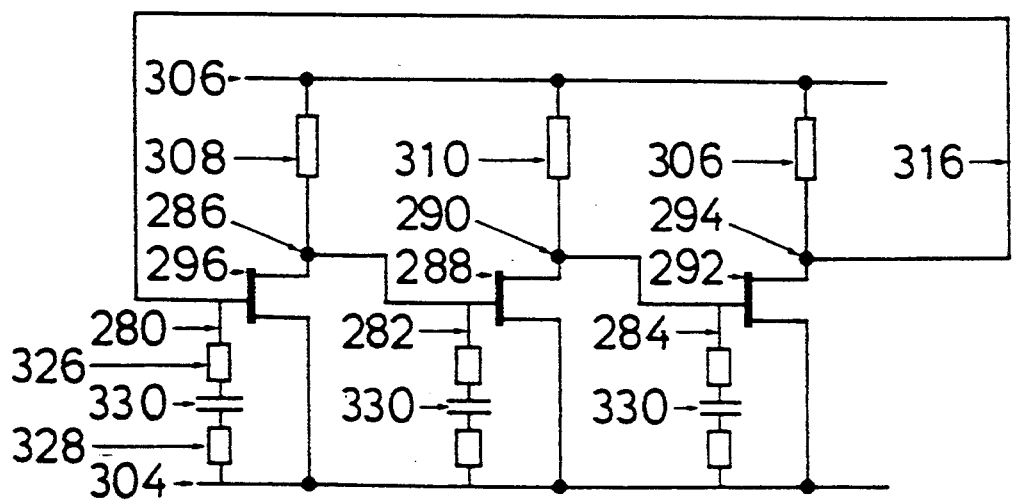
FIG. 28 is an equivalent circuit diagram of the ring oscillator of FIG. 27.

One way of obtaining a variable frequency oscillator for this purpose is shown in the diagrams of FIGS. 27 and 28 which show a cross-section similar to that of FIG. 25 and an equivalent circuit similar to that of FIG. 26 respectively.

In fact the only physical difference is that a back electrode 324 has been provided on the underside of the structure illustrated in FIGS. 24 and 25. By varying the potential applied to this back electrode it is possible to vary the effective capacitance between the gate of each field effect electrode and the common source terminal 304. In fact the provision of such a back electrode corresponds to the connection of two resistors 326, 328 separated by a capacitor 330 in series between the gate of each field effect transistor and the common source terminal 304. The changing of the bias potential applied to the back electrode represents a change in-the capacitance of each capacitor 330 and this in turn changes the natural frequency of oscillation of the ring oscillator.

Figure 29:
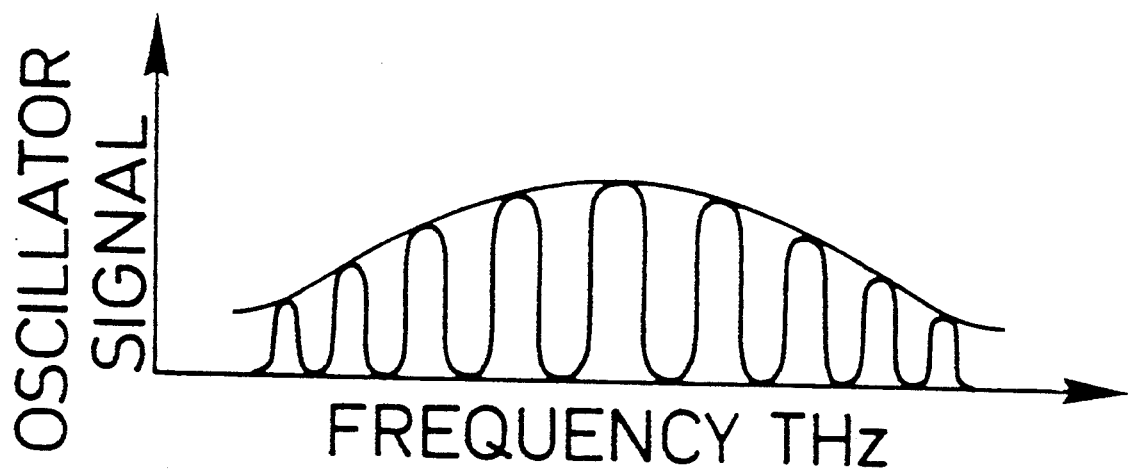
FIG. 29 shows a frequency response characteristic of the ring oscillator of FIGS. 27 and 28, and FIGS. 30A and 30B respectively show the source drain current/gate voltage and transconductance/gate voltage characteristics for a sample FET with etched trenches showing comparison curves for the case in which the FET is kept in a vacuum and for the case in which the etched trenches are filled with glycerine.

A typical frequency response characteristic is then shown in FIG. 29 and this frequency response characteristic will vary depending on the substances that are present in the etched trenches of the device. The precise shape of the frequency response characteristic, in particular the positions of peaks and troughs in the overall frequency envelope will be characteristic for the substance to be detected. Thus the detection of a particular frequency response characteristic will enable a unique identification of a particular substance.

As already mentioned the oscillators proposed herein are inherently capable of oscillating at very high frequencies and indeed at frequencies corresponding to the frequency of visible light. It is therefore believed that a plurality of such oscillators formed on one or more chips could act directly as a light source with a very high energy conversion efficiency. It may be necessary to provide each oscillator with a miniature horn antenna to permit the light yield to be realised, this may however not be necessary. If required the horn antenna could be formed on the chip by suitable vapour deposition techniques, if necessary by lithography and etching.

In conclusion, a novel deep mesa etched 1D in-plane-gate field-effect-transistor has been proposed. The device shows the versatility of the deep mesa etching technique [3, 4] and provides a further demonstration of the general IPG principle [1]. One of the main features of this device is the applicability of standard industrial fabrication techniques. Since the smallest structures are wider than 0.5 $\mu$m, fabrication by optical lithography is feasible. Together with the deep mesa etching process demonstrated here one gets a powerful and rapid tool to produce highly insulating vacuum trenches between gates and channel. The whole fabrication process is inherently self-aligning and hence easily applicable for device integration. The intrinsically small capacitance of in-plane-gates can possibly lead to faster microwave transistors. Although certainly our deep mesa etched in-plane-gate transistor is so far not optimised in all aspects, the current performance and in particular the high transconductance make it a very promising device.

[1] A. D. Wieck and K. Ploog, Appl. Phys. Lett. 56,928 (1990)

[2] Vacuum insulated sandwich type of top gates have been investigated by J. Moreland, J. Drucker, P. K. Hansma, J. P. Kotthaus, A. Adams, and R. Kvaas, Appl. Phys. Lett. 45, 104 (1984) and W. Ebner and J. P. Kotthaus, Proceedings of the International Conference on Insulating Films on Semiconductors, Toulouse (France), p.21 (1985).

[3] T. Demel, D. Heitmann, P. Grambow, and K. Ploog, Appl. Phys. Lett. 53,2176 (1989).

[4] P. Grambow. T. Demel, D. Heitmann, M. Kohl, R. Schüle, and K. Ploog, Microelectronic Engineering 9,357 (1989).

We claim:

1. A method of generating an active semiconductor structure from a starting structure having a surface and a two-dimensional charge carrier layer substantially parallel to said surface, the method comprising the steps of:
   a) treating the starting structure by lithographic and etching techniques to form trenches extending into said starting structure from said surface, thus producing lateral potential barriers in said two-dimensional charge carrier layer, said lateral potential barriers acting as linelike insulating boundaries extending through said two-dimensional charge carrier layer, said starting structure being divided up regionally by said insulating boundaries and comprising at least one closed region having a first boundary line and a second boundary line lying opposite to said first boundary line, said second boundary line being spaced from said first boundary line to form a channel region between said first and second boundary lines, said channel region having first and second ends communicating with respective regions of said two-dimensional charge carrier layer, said at least one closed region comprising a gate region, and
   b) forming contacts to said gate region and at said respective regions of said two-dimensional charge carrier layer at said first and second ends of said channel region.

2. A method in accordance with claim 1, wherein said starting structure is formed by a heterogenous semiconductor materials system.

3. A method in accordance with claim 2, wherein said heterogenous semiconductor materials system includes at least one compositional semiconductor material.

4. A method in accordance with claim 2, wherein said heterogenous semiconductor materials system is GaAs/AlGaAs.

5. A method in accordance with claim 1, wherein said starting structure is formed by a homogenous semiconductor material.

6. A method in accordance with claim 5, wherein said homogenous semiconductor material is silicon.

7. A method in accordance with claim 6, wherein said semiconductor material comprises a silicon substrate covered with a layer of silicon dioxide, and wherein, prior to etching, positive ions are implanted in said silicon dioxide layer adjacent the boundary with said silicon substrate, said positive ions inducing a layer of negative charge carriers in said silicon substrate adjacent the boundary with said silicon dioxide layer, and wherein said etching process is carried out to form trenches in said silicon dioxide layer which extend into said silicon substrate below the level of said induced layer of negative charge carriers.

8. A method in accordance with claim 7, wherein a protective paint covering is provided on said silicon dioxide layer.

9. A method in accordance with claim 6, wherein said semiconductor material comprises a silicon substrate and ions are implanted beneath the surface of this substrate to form a 2-dimensional charge carrier layer and wherein this substrate is subsequently etched to form trenches which extend into the substrate to a depth greater than the depth of said 2-dimensional charge carrier layer.

10. A method for the manufacture of an integrated or highly integrated circuit, wherein one takes a semiconductor starting structure having a surface and at least one 2D-charge carrier layer parallel to the surface and treats said starting structure by lithographic and etching techniques to form lateral potential barriers in said at least one 2D-charge carrier layer to define active and passive components, said active components having electrode and channel regions defined by respective portions of the 2D-charge carrier layer delimited by said lateral potential boundaries; wherein electrode regions of neighboring components which are connected to one another are in a conductive connection with one another via respective portions of said 2D-charge carrier layer located between them; wherein said electrode regions comprise gate regions for controlling conduction in said channel regions of said active components as well as first and second end regions communicating with respective ends of said channel regions; and wherein contacts are provided in selected ones of said electrode regions to the respective portions of said 2D-charge carrier layer.

11. A method in accordance with claim 10, wherein said starting structure is formed by a heterogenous semiconductor materials system.

12. A method in accordance with claim 11, wherein said heterogenous semiconductor materials system includes at least one compositional semiconductor material.

13. A method in accordance with claim 11, wherein said heterogenous semiconductor materials system is GaAs/AlGaAs.

14. A method in accordance with claim 10, wherein said starting structure is formed by a homogenous semiconductor material.

15. A method in accordance with claim 14, wherein said homogenous semiconductor material is silicon.

16. A method in accordance with claim 15, wherein said semiconductor material comprises a silicon substrate covered with a layer of silicon dioxide, and wherein, prior to etching, positive ions are implanted in said silicon dioxide layer adjacent the boundary with said silicon substrate, said positive ions inducing a layer of negative charge carriers in said silicon substrate adjacent the boundary with said silicon dioxide layer, and wherein said etching process is carried out to form trenches in said silicon dioxide layer which extend into said silicon substrate below the level of said induced layer of negative charge carriers, a protective paint covering being optionally provided on said silicon dioxide layer.

17. A method in accordance with claim 15, wherein said semiconductor material comprises a silicon substrate and ions are implanted beneath the surface of this substrate to form a 2-dimensional charge carrier layer and wherein this substrate is subsequently etched to form trenches which extend into the substrate to a depth greater than the depth of said 2-dimensional charge carrier layer.

* * * * *